US006539959B1

(12) United States Patent
Ohroku et al.

(10) Patent No.: US 6,539,959 B1
(45) Date of Patent: Apr. 1, 2003

(54) CLEANING APPARATUS FOR PLATE-LIKE PART AND METHOD THEREOF

(75) Inventors: Noriyuki Ohroku, Yokohama (JP); Yuichirou Tanaka, Fujisawa (JP); Yoichi Takahara, Yokohama (JP); Tomonori Saeki, Yokohama (JP); Susumu Aiuchi, Yokohama (JP); Hitoshi Oka, Yokohama (JP); Fumio Morita, Tokyo (JP); Masataka Fujiki, Toyoma-ken (JP); Akinobu Yamaoka, Toyama-ken (JP)

(73) Assignees: Hitachi, Ltd., Tokyo (JP); Kokusai Electronic Co., Ltd., Tokyo (JP)

( * ) Notice: Subject to any disclaimer, the term of this patent is extended or adjusted under 35 U.S.C. 154(b) by 0 days.

(21) Appl. No.: 09/498,355

(22) Filed: Feb. 4, 2000

(30) Foreign Application Priority Data

Mar. 24, 1999 (JP) ............................................ 11-078740
Feb. 5, 1999 (JP) ............................................ 11-029119

(51) Int. Cl.[7] .............................. B08B 3/10; B08B 7/04
(52) U.S. Cl. ............................ 134/153; 134/1; 134/1.3; 134/902
(58) Field of Search ................................. 134/153, 902, 134/1, 1.3, 140, 148, 149, 157

(56) References Cited

U.S. PATENT DOCUMENTS 6,374,836 B1 * 4/2002 Oroku ........................ 134/140

FOREIGN PATENT DOCUMENTS

WO    WO 99/20407    * 4/1999

OTHER PUBLICATIONS

Inaba et al, Antistatic Protection in Wafer Drying Process by Spin–Drying, IEEE Transactions on Semiconductor Manufacturing, vol. 5, No. 3, 234–240, Aug. 1992.*

IBM Technical Disclosure Bulletin, NA 84035188, Elimination of Electrical Charging During Processing Operations, Mar. 1984.*

* cited by examiner

Primary Examiner—Alexander Markoff
(74) Attorney, Agent, or Firm—Antonelli, Terry, Stout & Kraus, LLP

(57) ABSTRACT

At a time of cleaning a plate-like part such as a wafer or the like while rotating, for the purpose of reducing a contamination, a damage and an unevenness of process of the plate-like part which are caused by an amount of charged electricity of the plate-like part, chuck pins (chuck members) 201 which chuck the plate-like part 1 such as the wafer or the like and upper and lower cleaning plates 101 and 121 which oppose to the plate-like part 1 are constituted by a resin material containing carbon powders, and a desired potential difference is applied to a portion between the plate-like part and the cleaning plates by a voltage control unit 601 which is provided in an outer portion.

11 Claims, 16 Drawing Sheets

CLEANING APPARATUS FOR PLATE-LIKE PART AND METHOD THEREOF

BACKGROUND OF THE INVENTION

1. Field of the Invention

The present invention relates to a cleaning apparatus for a plate-like part which cleans a thin plate-like part such as a semiconductor wafer, a magnetic recording disc medium, a liquid crystal display panel, a Braun tube shadow mask and the like, and a method thereof.

Further, the present invention relates to a fluid treatment method for a substrate and a treating apparatus therefor, and particularly to a fluid treatment method for a substrate which is preferable for fluid treating a plate-like material such as a semiconductor wafer, a liquid crystal substrate, a magnetic disc and the like corresponding to a substrate to be treated in accordance with a single wafer method, and a treating apparatus therefor.

2. Description of the Prior Art

Conventionally, as a structure which cleans the plate-like part such as a silicon wafer and the like, for example, there is known a structure which is disclosed in Japanese Patent Unexamined Publication No. 8-130202 (a first prior art).

The cleaning apparatus described in the first prior art is provided with an upper cleaning plate which is opposed to an upper surface of the wafer, a lower cleaning plate which is opposed to a lower surface of the wafer, and a cylindrical wafer holding device which has an inner diameter coinciding with an outer diameter of the wafer. The wafer is held in a horizontal state, in a state that an outer periphery of the wafer is in contact with an inner peripheral surface of the wafer holding device. The upper cleaning plate and the lower cleaning plate are respectively arranged in parallel to the upper surface and the lower surface of the wafer, and injects a cleaning fluid to the upper surface and the lower surface of the wafer. At this time, the wafer holding device is rotated and the wafer held thereto is also rotated.

The cleaning fluid injected from a center of the upper cleaning plate is flown out from a portion between an outer peripheral edge of the upper cleaning plate and an outer peripheral edge of the upper surface of the wafer through a portion between the upper cleaning plate and the upper surface of the wafer. Further, the cleaning fluid injected from a center of the lower cleaning plate is flown out from a portion between an outer peripheral edge of the lower cleaning plate and an outer peripheral edge of the lower surface of the wafer through a portion between the lower cleaning plate and the lower surface of the wafer. A pressure in accordance with a Bernoulli's theorem is respectively generated between the upper cleaning plate and the upper surface of the wafer and between the lower cleaning plate and the lower surface of the wafer, by the cleaning fluid which respectively flows therethrough. At a time of rinsing the wafer, a delicate pressure balance is kept between the upper cleaning plate and the upper surface of the wafer and between the lower cleaning plate and the lower surface of the wafer.

However, the first prior art mentioned above takes into consideration a problem that in the case of setting an interval between the upper cleaning plate and the upper surface of the wafer and an interval between the lower cleaning plate and the lower surface of the wafer to an interval which is enough narrow to obtain an effect of improving a cleaning capacity, the wafer and the cleaning plate relatively move in a rinsing and drying step corresponding to the latter half of the wafer rinsing, whereby a static electricity is charged between the both and unnecessary reaction, contamination and damage are generated on the wafer surface.

That is, in the first prior art, since no attention is paid to the generation of the static electricity mentioned above, it is hard to avoid the unnecessary reaction, contamination and damage in the cleaning and drying process. Even in the case that a distance between the cleaning plate and the wafer is increased so as to reduce a flow speed of the fluid and reduce the generated static electricity, thereby reducing a transmission of an ionized ion due to the widened distance so as to reduce a charged amount, it is impossible to achieve a fundamental solution, and it is impossible to expect an effect of improving the cleaning capacity due to employment of the cleaning plate.

On the contrary, in the case of treating the plate-like part by using the narrow space for cleaning and drying, as is executed in the conventional spin cleaning apparatus, there is a method of introducing a gas such as a nitrogen and the like which is charged with positive or negative electricity so as to neutralize the charged electricity, however, this method has a little effect. Because in accordance with the method of employing the charged gas, the gas charging with an opposite polarity to that of the member charging with the static electricity is attracted to the member, thereby neutralizing the charged electricity, however, when introducing the gas charging with the positive or negative electricity to the narrow space, the gas is rapidly mixed with itself and neutralizes itself, so that the effect of neutralizing the charged electricity of the plate-like part corresponding to the subject to be cleaned is rapidly removed. Accordingly, the effect is restrictedly obtained near the pole of the gas supply portion.

Further, as the conventional fluid treating apparatus for the semiconductor substrate and the like in accordance with the single wafer method, there is known a cleaning apparatus which irradiates a treating fluid such as a liquid or a gas toward a substrate while rotating the substrate (for example, Japanese Patent Unexamined Publication No. 4-287922). In the case of performing a cleaning process, a rinsing process and a drying process in this order, the process is performed by subsequently irradiating a cleaning fluid from a first nozzle, a rinsing fluid from a second nozzle and a nitrogen from a third nozzle, toward the substrate while rotating the substrate.

In the case of irradiating the cleaning fluid or the rinsing fluid so as to rotate the substrate, the cleaning fluid or the rinsing fluid is attached to the inner wall of the treating tank. Since the substrate is rotated at a high speed in the drying process, a downward air current toward the substrate is generated together with the rotation and a vortex air current is generated within the treating tank. The cleaning fluid or the rinsing fluid attached to the inner wall of the treating tank is carried on the vortex air current, is attached to the surface of the substrate and causes a recontamination.

As a method of preventing a recontamination to the substrate mentioned above, there is a method of placing a plate opposite to the substrate, for example, there is known a cleaning apparatus disclosed in Japanese Patent Unexamined Publication Nos. 8-130202 and 8-78368. These are structured such that the process is performed by gripping the substrate from upper and lower portions by the cleaning plate and subsequently supplying the cleaning fluid, the rinsing fluid or the nitrogen gas from a center portion, and since it is possible to prevent the air current toward the substrate by the cleaning plate even in the case of high speed rotation, it is possible to prevent the recontamination onto the surface of the substrate.

For example, in a step for restricting a growth of a natural oxidation film such as a step prior to a gate oxidation film forming step of a semiconductor manufacturing step or the like, it is necessary to control an atmosphere after cleaning to a high level for restricting oxidation. In a conventional apparatus having a wide treatment space, since a lot of time is required for replacing the atmosphere, it is necessary to reduce the treatment space as much as possible. Further, it is also possible to reduce an amount of consumption of the treating fluid by making the treatment space small.

However, in the case of performing a drying process by setting an interval between a cleaning plate 7 and a substrate to be treated 8 to 0.6 mm to 1.0 mm with using an apparatus shown in FIG. 17, an inferior drying is partly generated after the drying process. In this case, in FIG. 17, reference numerals 7a and 9a denote a fluid supply port, from which a cleaning fluid necessary for the fluid treatment and a gas for drying and the like are supplied.

As a result of in detail researching a reason for which the inferior drying is generated, it is known that a water drop leaves on the substrate due to the static electricity generated by a rotation of the substrate 8 and the inferior drying is generated due to a reaction between a surface of the substrate and the water drop.

In particular, in the rinsing and drying process after removing the natural oxidation film prior to the gate oxidation film forming process in the semiconductor manufacturing step, or in the rinsing and drying process after removing the natural oxidation film prior to forming a film of a wire material to a bottom portion of a contact hole, an inferior drying so called as a water mark is formed, thereby significantly deteriorating a quality of a product. Further, since the static electricity generated on the surface of the substrate involves the reattachment of foreign materials, a problem is generated.

In the cleaning apparatus for the semiconductor, in order to prevent the recontamination within the apparatus, a fluid contact portion is made of a plastic material which has a high purity and is excellent in a resistance against chemicals, such as a polytetrafluoroethylene, a polyether ether ketone or the like. These plastic material are easily charged, and in particular easily generates the static electricity due to a frictional electricity charge caused by the rotation.

When measuring an electric potential of the static electricity generated on the surface of the cleaning plate after performing the drying process with using the cleaning plate 7 made of a polytetrafluoroethylene, it is known that the electric potential increases in a negative direction toward an outer periphery of the cleaning plate and is reduced in an outermost periphery, as shown in FIG. 18.

Further, when measuring the electric potential of the static electricity on the substrate 2, it is known that a portion at which an absolute value of the electric potential is high exists at substantially the same position as the cleaning plate 7, as shown in FIG. 19.

Further, when measuring the inferior drying, it is known that it is easily generated in the portion where the static electricity is most possibly generated on the substrate 8, as shown in FIG. 20. When switching from the rinsing process to the drying process, the number of rotation is increased (for example, from 100 rpm to 1000 rpm), whereby the rinsing fluid nipped between the surface of the substrate and the cleaning fluid becomes the water drop due to a centrifugal force and is discharged to an outer portion of the substrate. However, it is considered that the static electricity generated by the rotation is generated as shown in FIGS. 18 and 19, and the water drop is attracted to the static electricity so as to leave between the substrate 8 and the cleaning plate 7, thereby causing the inferior drying of the substrate.

SUMMARY OF THE INVENTION

The present invention is made so as to solve the problems mentioned above, and an object of the present invention is to provide a cleaning apparatus for a plate-like part which can prevent unnecessary reaction, contamination and damage from being generated on the plate-like part due to a static electricity while maintaining an effect of improving a cleaning capacity due to employment of a cleaning plate, and a method thereof.

Further, an object of the present invention is to solve the conventional problems mentioned above, and to provide a fluid treating method for a substrate which does not generate an inferior drying in a drying process after a fluid treatment such as a cleaning or the like by preventing the static electricity from being generated, and a fluid treating apparatus.

In order to achieve the objects mentioned above, in accordance with the present invention, there is provided a cleaning apparatus for a plate-like part comprising:

supporting and rotating means which supports the plate-like part having two flat surfaces being substantially in parallel to each other and rotates it within the flat surfaces;

a cleaning plate which is placed in the plate-like part rotated by the supporting and rotating means so as to oppose to at least one of the two flat surfaces in a parallel state;

treating fluid injecting means which injects a treating fluid to one flat surface of the plate-like part from the cleaning plate so as to clean one flat surface; and potential difference applying means which applies a desired potential difference between the plate-like part and the cleaning plate so as to control a terminal end condition (for example, an oxygen terminal condition, that is, an oxidation film condition) after cleaning on one flat surface of the plate-like part.

Further, in accordance with the present invention, there is provided a cleaning apparatus for a plate-like part comprising:

supporting and rotating means which supports the plate-like part having two flat surfaces being substantially in parallel to each other and rotates it within the flat surfaces;

a cleaning plate which is placed in the plate-like part rotated by the supporting and rotating means so as to oppose to at least one of the two flat surfaces in a parallel state;

treating fluid injecting means which injects a treating fluid for cleaning and drying to one flat surface of the plate-like part from the cleaning plate so as to clean one flat surface; and potential difference applying means which applies a desired potential difference between the plate-like part and the cleaning plate so as to control a terminal end condition (for example, an oxygen terminal condition, that is, an oxidation film condition) after cleaning and drying on one flat surface of the plate-like part.

Further, in accordance with the present invention, there is provided a cleaning apparatus for a plate-like part comprising:

supporting and rotating means which supports the plate-like part having two flat surfaces being substantially in parallel to each other and rotates it within the flat surfaces;

a cleaning plate which is placed in the plate-like part rotated by the supporting and rotating means so as to oppose to at least one of the two flat surfaces in a parallel state;

treating fluid injecting means which injects a treating fluid for cleaning and drying to one flat surface of the plate-like part from the cleaning plate so as to clean one flat surface; and potential difference applying means which applies a desired negative potential difference to the plate-like part with respect to the cleaning plate so as to control a terminal end condition (for example, an oxygen terminal condition, that is, an oxidation film condition) after cleaning and drying on one flat surface of the plate-like part.

Further, in accordance with the present invention, there is provided a cleaning apparatus for a plate-like part comprising:

supporting and rotating means which supports the plate-like part having two flat surfaces being substantially in parallel to each other and rotates it within the flat surfaces;

a pair of cleaning plates which are placed in the plate-like part rotated by the supporting and rotating means so as to oppose to the two flat surfaces in a parallel state;

treating fluid injecting means which injects a treating fluid to two flat surfaces of the plate-like part from each of the pair of cleaning plates so as to clean two flat surface; and potential difference applying means which applies a desired potential difference between the plate-like part and the pair of cleaning plates so as to control a terminal end condition (for example, an oxygen terminal condition, that is, an oxidation film condition) after cleaning on two flat surfaces of the plate-like part.

Further, in accordance with the present invention, there is provided a cleaning apparatus for a plate-like part as cited in the above, in which the cleaning plate is constituted by a material having an electric conductivity, and electric power supplying means for supplying electric current to the cleaning plate is provided as the potential difference applying means.

Further, in accordance with the present invention, there is provided a cleaning apparatus for a plate-like part as cited in the above, in which the cleaning plate is constituted by a material having a desired electric charge characteristic, and the potential difference applying means is structured such as to apply a potential difference due to a static electricity charge generated by a relative motion between the cleaning plate and the plate-like part.

Further, in accordance with the present invention, there is provided a cleaning apparatus for a plate-like part as cited in the above, in which the cleaning plate is constituted by a material having an insulative coating applied to at least surface opposing to the plate-like part and having an electric conductivity, and electric power supplying means for supplying electric current to an electrically conductive portion of the cleaning plate is provided as the potential difference applying means.

Further, in accordance with the present invention, there is provided a cleaning apparatus for a plate-like part as cited in the above, in which a supporting member for supporting the plate-like part in the supporting and rotating means is constituted by a material having an electric conductivity, and electric power supplying means for supplying electric current to the supporting member is provided as the potential difference applying means.

Further, in accordance with the present invention, there is provided a cleaning apparatus for a plate-like part as cited in the above, in which both two of the cleaning plates are constituted by a material having an electric conductivity, these cleaning plates are held in an electrically insulated state from the plate-like part and are structured such as to cancel an undesirable electric charge by supplying an electric current to both of them so that a necessary potential difference is applied between the cleaning plate and the plate-like part. In this case, since there is a case that the electrically conductive material is damaged during the cleaning by some chemicals employed for the cleaning fluid, a surface of the cleaning plate is required to be coated with a material having a resistance against chemicals.

Further, in accordance with the present invention, there is provided a cleaning apparatus for a plate-like part as cited in the above, in which the cleaning plate is constituted by a material having a preferable electric charging characteristic, for example, in the case that the plate-like part is a silicone, a polystyrene having an electric charging characteristic similar thereto, whereby a great electric charge over a necessary amount is not generated even when keeping the cleaning plate and the plate-like part in an electrically insulating manner.

Further, in accordance with the present invention, there is provided a cleaning apparatus for a plate-like part as cited in the above, in which in the case that required cleaning levels and chemicals employed for cleaning are different between an upper surface (a front surface) and a lower surface (a back surface) of the plate-like part, two front and back cleaning plates are made of different materials, for example, a fluorocarbon resin, a vinyl chloride or the like, thereby mutually generating an electric charge and changing a characteristic between the front and back of the plate-like part.

Further, in accordance with the present invention, there is provided a cleaning method for a plate-like part comprising the steps of:

injecting a treating fluid from a cleaning plate which is placed in the plate-like part having two flat surfaces being substantially in parallel to each other to one of the flat surfaces of the plate-like part and simultaneously rotating the plate-like part within the flat surface so as to clean one flat surface; and applying a desired potential difference between the plate-like part and the cleaning plate so as to control a terminal end condition after cleaning on one flat surface of the plate-like part.

Further, in accordance with the present invention, there is provided a cleaning method for a plate-like part comprising the steps of:

injecting a treating fluid from a cleaning plate which is placed in the plate-like part having two flat surfaces being substantially in parallel to each other to one of the flat surfaces of the plate-like part and simultaneously rotating the plate-like part within the flat surface so as to clean one flat surface; and injecting a drying treating fluid onto one of the flat surfaces of the plate-like part from the cleaning plate, simultaneously rotating the plate-like part within the flat surface so as to dry the one flat surface and simultaneously applying a desired potential difference between the plate-like part and the cleaning plate so as to control a terminal end condition after drying on the one flat surface of the plate-like part.

Further, in accordance with the present invention, there is provided a cleaning method for a plate-like part comprising the steps of:

injecting a treating fluid from a cleaning plate which is placed in the plate-like part having two flat surfaces being substantially in parallel to each other to one of the flat surfaces of the plate-like part and simultaneously rotating the plate-like part within the flat surface so as to clean one flat surface; and injecting a drying treating fluid onto one of the flat surfaces of the plate-like part from the cleaning plate, simultaneously rotating the plate-like part within the flat surface so as to dry the one flat surface and simultaneously applying a desired negative potential difference to the plate-like part with respect to the cleaning plate so as to control a terminal end condition after cleaning and drying on the one flat surface of the plate-like part.

As mentioned above, in accordance with the structures mentioned above, even when the interval between the cleaning plate and the plate-like part is set to the interval which is enough narrow to obtain the effect of improving the cleaning capacity so as to relatively rotate the plate-like part with respect to the cleaning plate, it is possible to reduce the static electricity charged between the both in the rinsing and drying step corresponding to the latter half step for cleaning the plate-like part so as to prevent the unnecessary reaction, contamination and damage from being generated on the surface of the plate-like part.

Various kinds of reaction, contamination and damage are included in this unnecessary reaction, contamination and damage, however, a generation of an oxidation film, an absorption of foreign matters and a damage of a circuit pattern such as a semiconductor device or the like. The generation of the oxidation film is structured such that an oxygen mixed in the drying process is activated by an electric field caused by the static electricity mentioned above so as to cause an unnecessary oxidation on the surface of the plate-like part such as a wafer or the like. The absorption of the foreign matters is structured such that a member charged by the static electricity attracts fine dusts and absorbs them by an electric force, whereby it is hard to remove them. The damage of the circuit pattern such as the semiconductor device or the like is structured such that since the static electricity charge is unevenly and rapidly discharged in the step of taking the plate-like part such as the wafer or the like out of the apparatus, excessive voltage and current are generated in a part of the already formed circuit pattern such as the semiconductor device or the like, whereby an insulating breakage and damage by a fire are generated.

Further, in order to solve the problems mentioned above, it is important to prevent the static electricity from generating at a time of starting the drying process after the rinsing process is finished. In accordance with the present invention, it is possible to achieve the object by the following first to third methods.

At first, in accordance with a first method, there is provided a fluid treatment method comprising the steps of:

forming a gap corresponding to a fluid passage between both of front and back surfaces of a substrate to be treated and a treating plate provided in such a manner as to oppose to them; and injecting a fluid from a center portion of the treating plate while relatively rotating the substrate to be treated and the treating plate so as to supply the fluid to the gap corresponding to the fluid passage, wherein the treating plate is made of an electrically conductive material having a surface natural resistance of 1 GΩ or less and the step further comprises a step of fluid treating the surface of the substrate to be treated in a state of grounding the treating plate on the earth.

The fluid treatment method can be realized by a fluid treatment apparatus comprising a chuck mechanism for holding a substrate to be treated, a treating plate provided so as to oppose to both front and back surfaces of the substrate to be treated and to form a gap corresponding to a fluid passage on the opposing surfaces, and means for injecting a fluid from a center portion of the treating plate while relatively rotating the substrate to be treated and the treating plate so as to supply the fluid to a gap corresponding to the fluid passage, wherein the treating plate is made of an electrically conductive material having a surface natural resistance of 1 GΩ or less and the treating plate is grounded on the earth.

Generally, in order to remove the static electricity, it is said to be necessary that the constructing material is set to a non-charging material and the surface natural resistance is set to 1 GΩ or less. Accordingly, in order to make the treating plate to achieve the effect of preventing an electricity charging, it is necessary to set the natural resistance to 1 GΩ or less and grounds on the earth.

Since the treating plate mentioned above does not generate the static electricity and the static electricity is not generated on the substrate to be treated corresponding to the plate-like material, an inferior drying is not generated.

In accordance with a second method, there is provided a fluid treatment method comprising the steps of:

forming a gap corresponding to a fluid passage between both of front and back surfaces of a substrate to be treated and a treating plate provided in such a manner as to oppose to them; and injecting a fluid from a center portion of the treating plate while relatively rotating the substrate to be treated and the treating plate so as to supply the fluid to the gap corresponding to the fluid passage, wherein at least a surface opposing to the substrate to be treated of the treating plate is coated with an electrically conductive material having a surface natural resistance of 1 GΩ or less and the step further comprises a step of fluid treating the surface of the substrate to be treated in a state of grounding the coated surface of the treating plate on the earth.

Then, the fluid treatment method can be realized by a fluid treatment apparatus comprising a chuck mechanism for holding a substrate to be treated, a treating plate provided so as to oppose to both front and back surfaces of the substrate to be treated and to form a gap corresponding to a fluid passage on the opposing surfaces, and means for injecting a fluid from a center portion of the treating plate while relatively rotating the substrate to be treated and the treating plate so as to supply the fluid to a gap corresponding to the fluid passage, wherein at least a surface opposing to the substrate to be treated of the treating plate is coated with an electrically conductive material having a natural resistance of 1 GΩ or less and the coated surface of the treating plate is grounded on the earth.

In this second method, it is also suitable for the case that the treating plate is constituted by an insulating material such as a ceramic, a plastic and the like, or a metal having a high resistance.

Since no static electricity is generated on the treating plate and the substrate to be treated in the same manner as that of the first method, also in the case of coating the surface with the electrically conductive material, it is possible to prevent an inferior drying.

In accordance with a third method, there is provided a fluid treatment method as recited in the first method mentioned above, wherein at least a surface opposing to a substrate to be treated of the treating plate (the electrically conductive material having the natural resistance of 1 G$\Omega$ or less) is constituted by a treating substrate to which a treatment for a resistance against chemicals is applied. Accordingly, various kinds of treating liquid chemicals can be employed as the treating fluid and it is also possible to extend a resisting time of the treating plate. As the chemical resisting process in this case, for example, a diamond coating, and a process of coating an electrically conductive polytetrafluoroethylene, a polyether ether ketone or the like can be applied.

In this case, in each of the methods mentioned above, as the method of relatively rotating the substrate to be treated and the treating plate, for example, there are (1) a method of rotating the substrate to be treated and fixing the treating plate, (2) a method of rotating the treating plate and fixing the substrate to be treated, (3) a method of rotating both of the substrate to be treated and the treating plate (in this case, mutually rotating in opposite directions or differentiating the speeds of rotation in the case of the same rotating directions), and the like.

Any rotating methods can be employed, however, the (1) method is actually excellent since a movable portion is reduced in comparison with the other methods and the construction of the apparatus is simple. In this case, the chuck mechanism for holding the substrate to be treated may also have a rotating function.

DETAILED DESCRIPTION OF THE PREFERRED EMBODIMENTS

Figure 1:
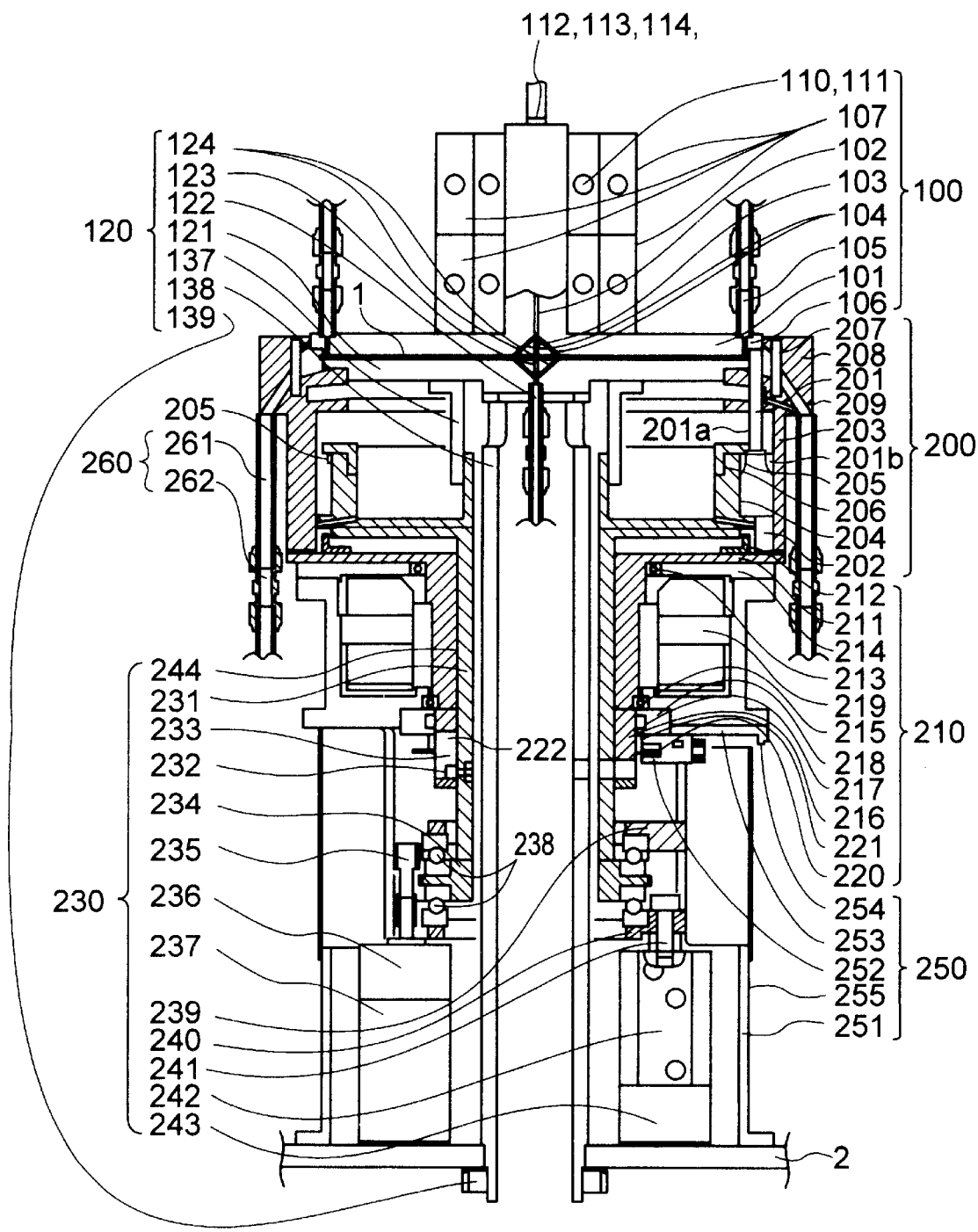
FIG. 1 is a vertical cross sectional view which shows an embodiment of a cleaning apparatus for a plate-like part in accordance with the present invention.
Figure 2:
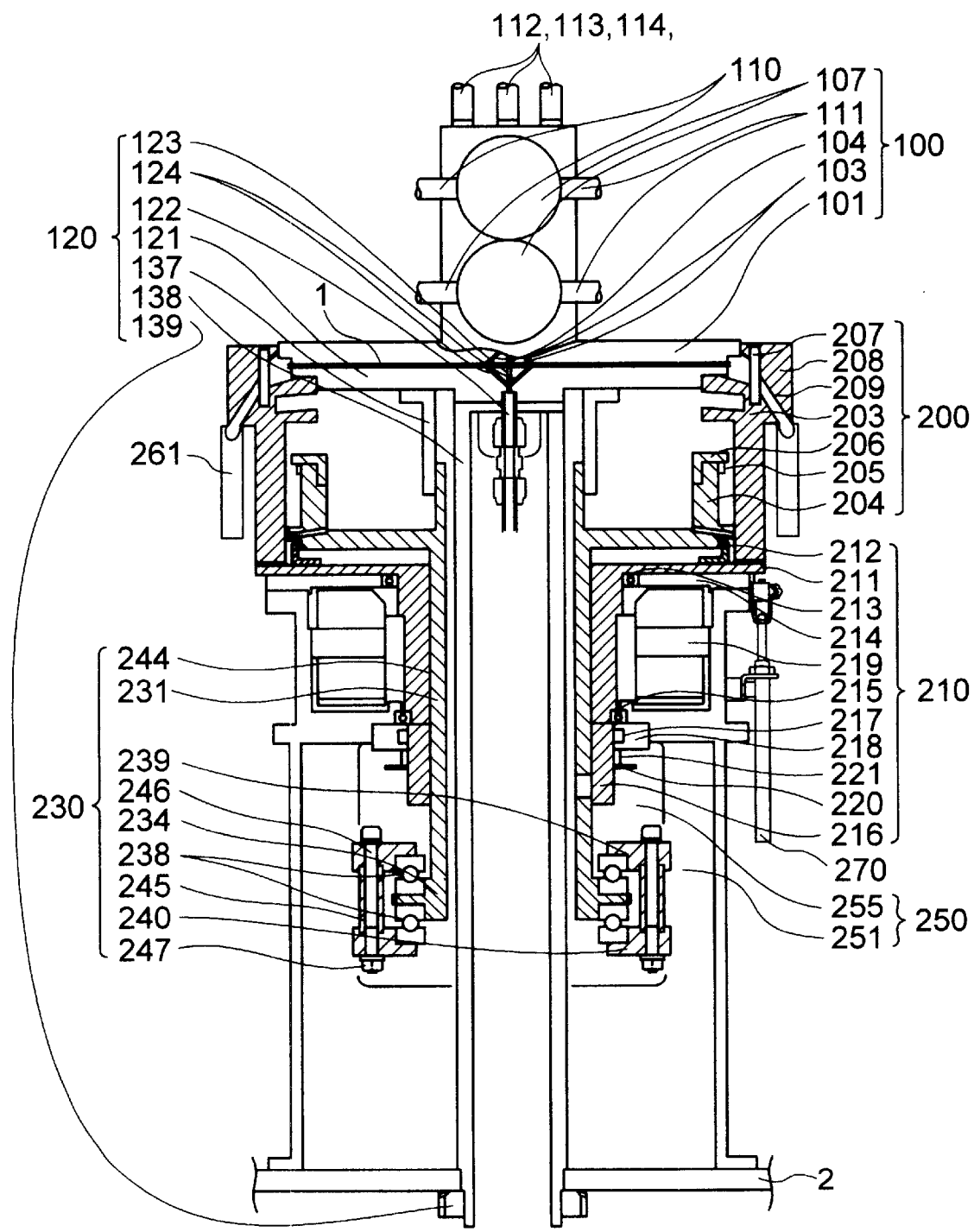
FIG. 2 is a vertical cross sectional view which shows an embodiment of a cleaning apparatus for a plate-like part in accordance with the present invention from another direction.

A description will be given of an embodiment of a cleaning apparatus in accordance with the present invention with reference to the accompanying drawings.

A cleaning apparatus is structured such as to clean a disc-like plate-like part (for example, a silicone wafer) 1, and is provided with an upper cleaning unit 100 which cleans an upper surface of the disc-like plate-like part (for example, a wafer) 1, a lower cleaning unit 120 which cleans a lower surface of the plate-like part 1, a plate-like part supporting unit 200 which supports the plate-like part 1, an inner wheel driving system 230 which drives an inner wheel (mentioned below) 204 of the plate-like part supporting unit 200 so as to attach and detach the plate-like part 1 with respect to the supporting unit 200, an outer wheel driving system 210 which rotates an outer wheel (mentioned below)

203 and the inner wheel 204 of the plate-like part supporting unit 200 so as to rotate the plate-like part 1 supported to the supporting unit 200, a chassis unit 250 which supports and covers each of the drive systems 210 and 230, a gas and liquid recovery unit 260 which is placed so as to recover a treating fluid with respect to the plate-like part 1, a treating fluid supplying unit 500 (particularly shown in FIG. 8) which supplies a treating fluid to the upper and lower cleaning unit 100 and 120, an outer wheel stopping unit 270 (particularly shown in FIG. 5) which is brought into contact with the outer wheel 203 so as to stop a rotation of the outer wheel 203, and the upper cleaning unit 100.

Figure 3:
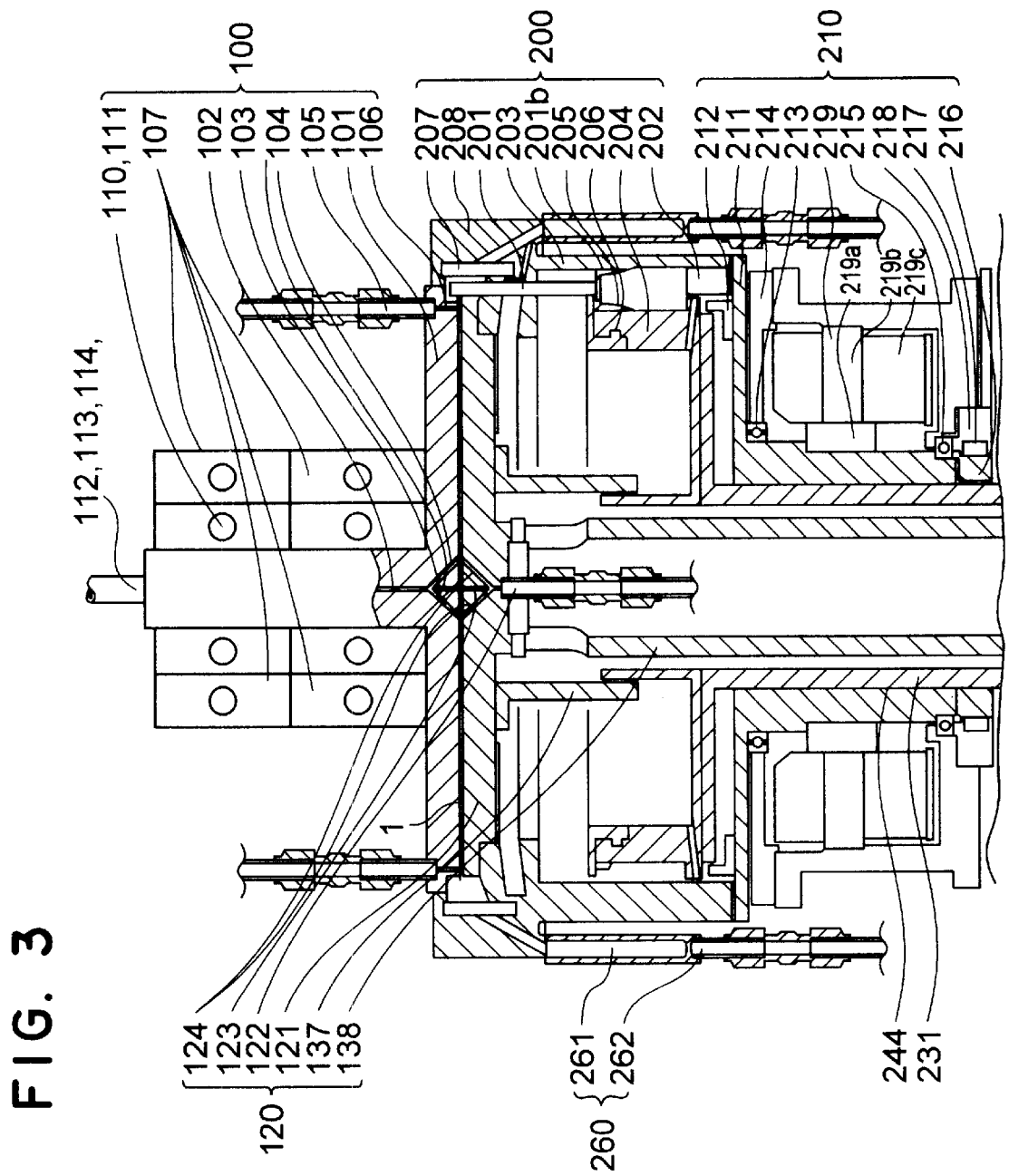
FIG. 3 is an upper vertical cross sectional view which shows an embodiment of a cleaning apparatus for a plate-like part in accordance with the present invention.
Figure 5:
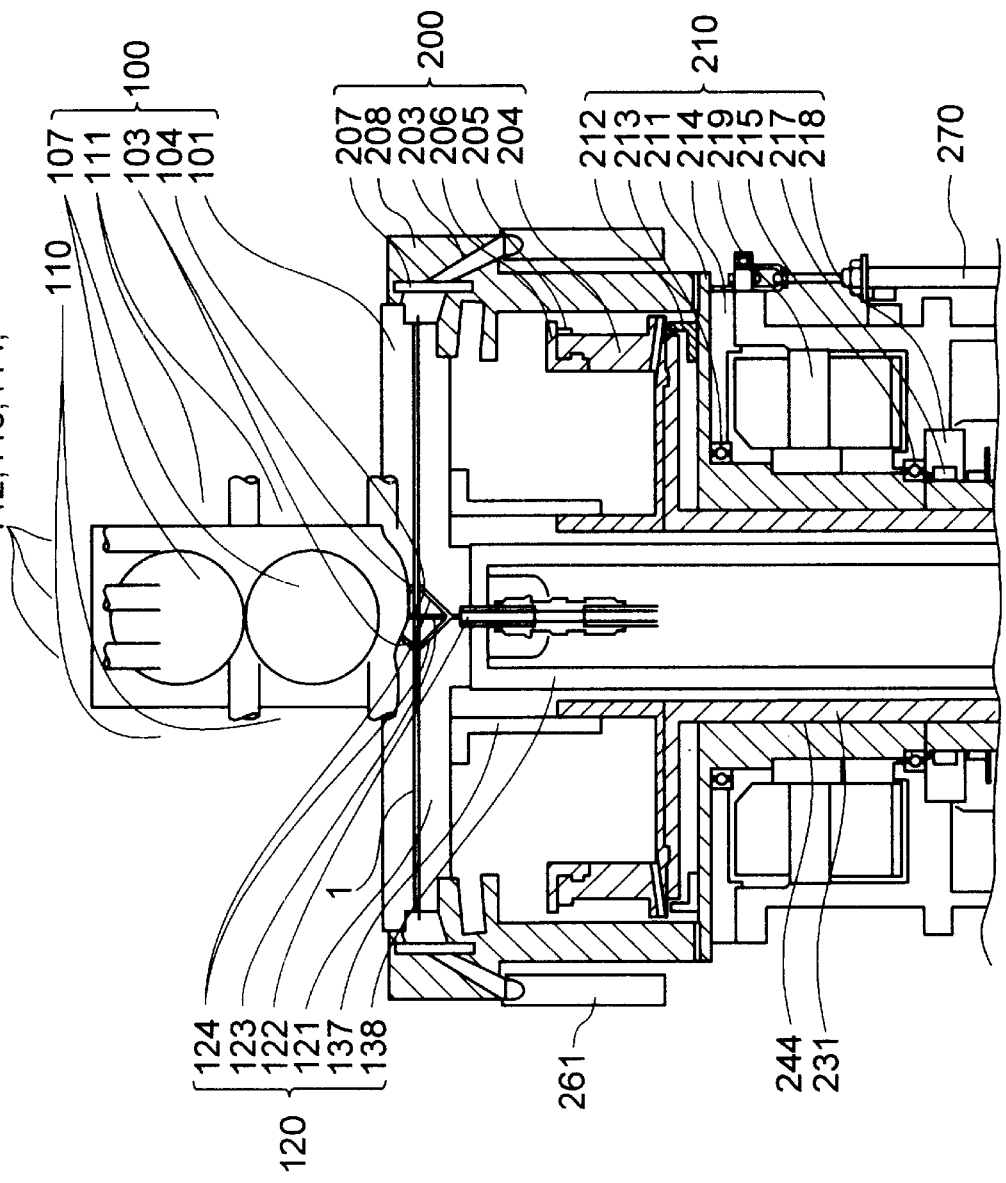
FIG. 5 is an upper vertical cross sectional view which shows an embodiment of a cleaning apparatus for a plate-like part in accordance with the present invention from another direction.

The upper cleaning unit 100 is provided with an upper cleaning plate 101 which is arranged on an upper surface of the plate-like part horizontally supported by the plate-like part supporting unit 200 so as to be in parallel thereto and oppose thereto, and an upper valve unit 107 which switches a treating fluid injecting out on the upper surface of the plate-like part 1, as shown in FIGS. 3 and 5.

The upper cleaning plate 101 is formed in a disc shape, and a lower surface thereof is formed in a flat shape. On the upper cleaning plate 101, as shown in FIG. 3, there are formed an upper introducing pipe 102 through which the treating fluid from the valve unit 107 flows, an upper main injecting port 103 which is communicated with the upper introducing pipe 102 and injects out the treating fluid to a center of the lower surface of the upper cleaning plate 101, an upper auxiliary injecting port 104 which is communicated with the upper introducing pipe 102 and injects out the treating fluid to the lower surface of the upper cleaning plate 101 and around the upper main injecting port 103, and an upper peripheral injecting port 106 (shown in FIG. 3) which is arranged in a peripheral portion of the upper cleaning plate 101, extends through the upper cleaning plate 101 from the upper surface to the lower surface and injects out the treating fluid. An upper peripheral introducing pipe 105 is connected to an upper peripheral injecting port 106. The upper valve unit 107 is driven by an air as shown in FIGS. 3 and 5, in which an upper valve drive air introducing port 110 and an upper valve drive air discharging port 111 are formed. Further, the upper valve unit 107 is structured such as to switch to supply a chemical liquid, a pure water and a drying nitrogen to the upper cleaning plate 101, and a chemical liquid upper supply port 112, a pure water upper supply port 113 and a drying nitrogen upper supply port 114 are also formed therein.

The lower cleaning unit 120 is provided with a lower cleaning plate 121 which is arranged in the lower surface of the plate-like part 1 horizontally supported by the plate-like part supporting unit 200 in such a manner as to be in parallel thereto and oppose thereto, and a cylindrical supporting shaft 138 which supports the lower cleaning plate 121, as shown in FIGS. 3 and 5.

The lower cleaning plate 121 is formed in a disc shape and an upper surface thereof is formed in a flat shape. A lower introducing pipe 122 through which the treating fluid passes is connected to a center of the lower surface of the lower cleaning plate 121, as shown in FIG. 3. Further, on the lower cleaning plate 121, there are formed a lower main injecting port 123 which is connected to the lower introducing pipe 122 and injects out the treating fluid to a center of the upper surface of the lower cleaning plate 121, and a lower auxiliary injecting port 124 which is connected to the lower introducing pipe 122 and injects out the treating fluid to the upper surface of the lower cleaning plate 121 and around the lower main injecting port 123.

Figure 4:
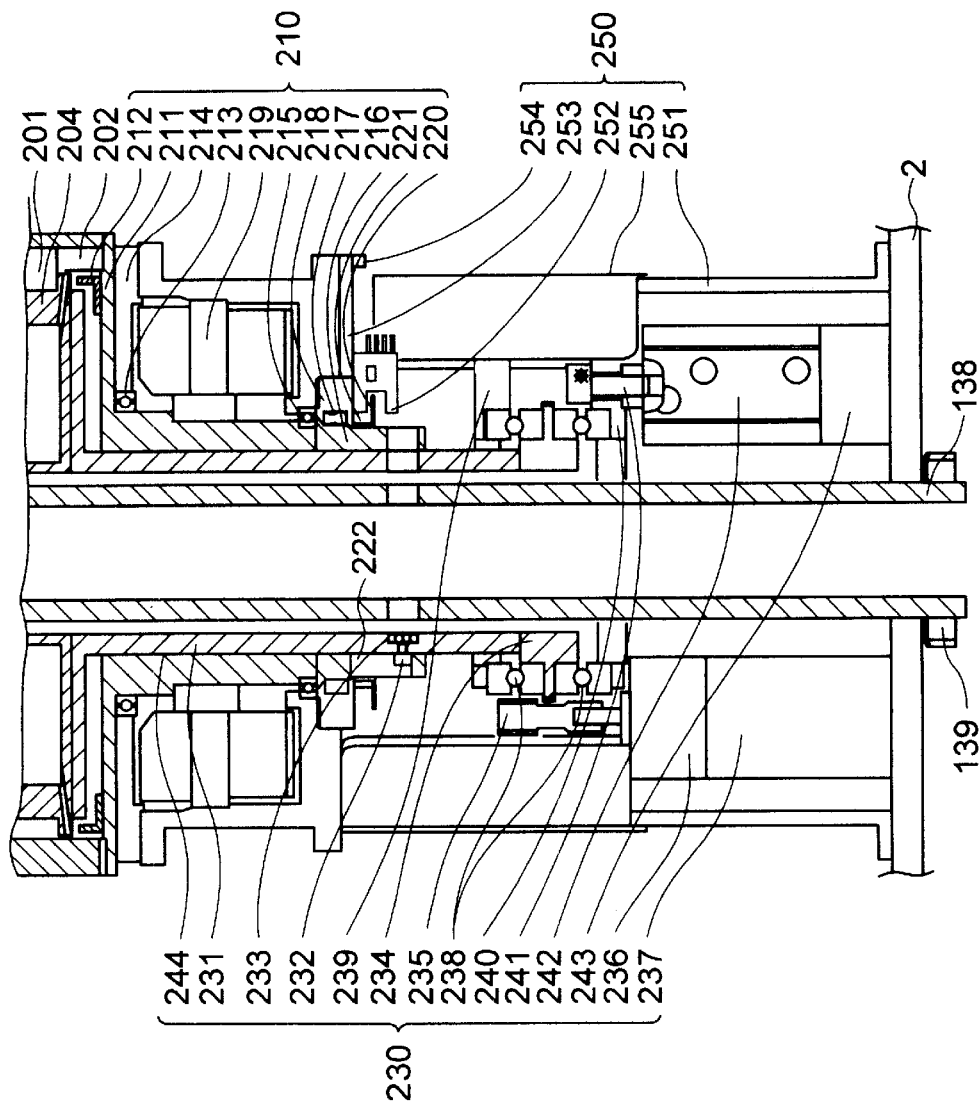
FIG. 4 is a lower vertical cross sectional view which shows an embodiment of a cleaning apparatus for a plate-like part in accordance with the present invention.
Figure 6:
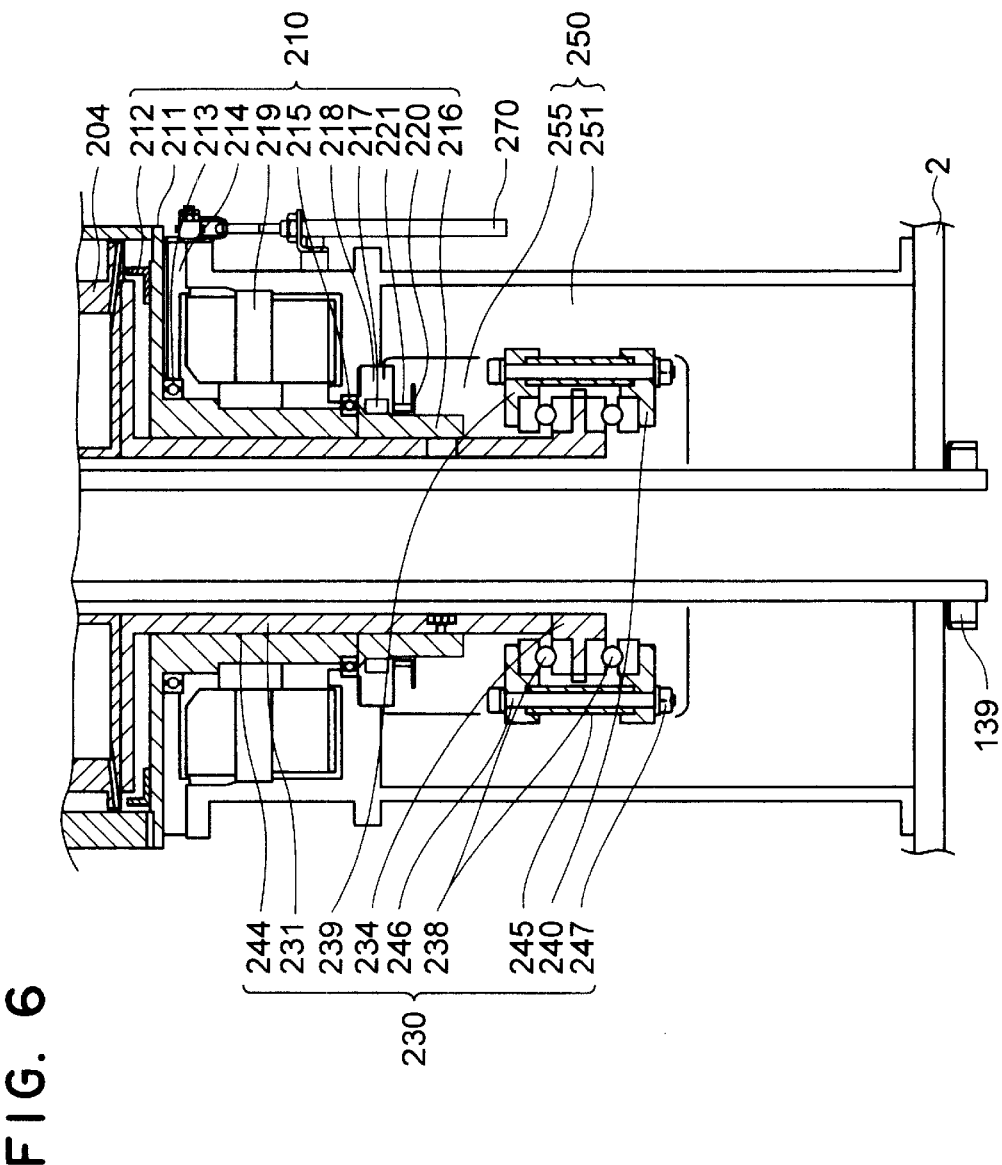
FIG. 6 is a lower vertical cross sectional view which shows an embodiment of a cleaning apparatus for a plate-like part in accordance with the present invention from another direction.

A supporting shaft 138 is formed in a hollow cylindrical shape as shown in FIGS. 3 and 5, and the lower cleaning plate 121 is fixed to the upper end thereof. On the lower surface of the lower cleaning plate 121, a cylindrical sputter preventing wall 137 is fixed at a position around the upper portion of the supporting shaft 138. A lower introducing pipe 122 connected to the center of the lower surface of the lower cleaning plate 121 passes within the hollow cylindrical supporting shaft 138. A lower end of the supporting shaft 138 slightly passes through a casing 2, as shown in FIGS. 4 and 6, and is fixed to the casing 2 by a shaft fixing screw 139. That is, the lower cleaning plate 121 is indirectly fixed to the casing 2 via the supporting shaft 138.

The upper cleaning unit 100 and the lower cleaning unit 120 mentioned above are basically constituted by a material having a high resistance against chemicals such as a fluorocarbon resin or the like except that the supporting shaft 138 and the fixing screw 139 are made of stainless steel, and are not corroded by chemicals such as acid, alkaline and the like which are used for cleaning. Further, since these units do not support a high load, there is no problem even when being constituted by a material having a relatively low rigidity such as a fluorocarbon resin or the like.

The plate-like part supporting unit 200 is, as shown in FIGS. 3 and 5, provided with a plurality of (for example, three at 120 degrees interval) chuck pins 201 on which a taper-shaped chuck groove (shown in FIG. 15) 201c to which an outer peripheral edge of the plate-like part (for example, the wafer) 1 is fitted is formed, an outer wheel 203 which revolves (rotates) a plurality of chuck pins 201 around the supporting shaft 138 together with the inner wheel 204 so as to rotate the plate-like part 1 supported by the chuck pin 201 around the supporting shaft 138, an inner wheel 204 which rotates a plurality of chuck pins 201 on its own axis due to a relative rotation with respect to the outer wheel 203 so as to make the outer periphery of the plate-like part 1 from the chuck groove 201c or fit to the chuck groove 201c, and vertically moves a plurality of chuck pins 201 mentioned above, a pin holder 206 which holds so that the a plurality of chuck pins 201 do not relatively move in a vertical direction with respect to the inner wheel 204, a substantially cylindrical outer wheel hood (a coating member) 208 which is arranged on an outer periphery of the upper portion of the outer wheel 203, and a plurality of connecting pins 207 which fixes the outer wheel hood 208 to the upper portion of the outer wheel 203. In this case, a fluid passage 209 for recovering a waste liquid discharged from the outer periphery of the plate-like part 1 to the gas and liquid recovery unit 260 is formed between the upper portion of the outer wheel 203 and the outer wheel hood 208.

Figure 15:
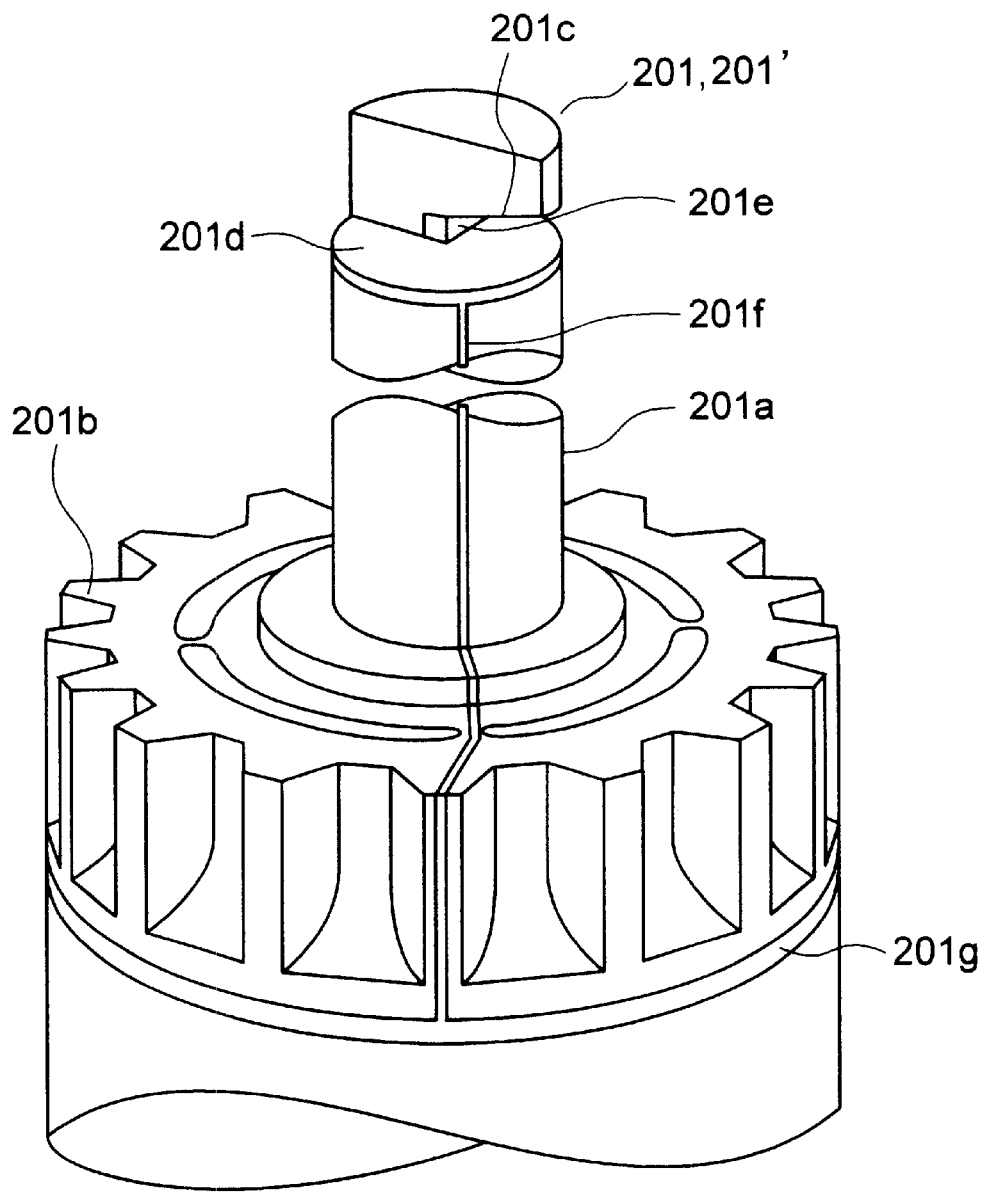
FIG. 15 is a main portion perspective view which shows a structure of a chuck pin including a great electric current correspondence in accordance with the present invention.

The chuck pin 201 has a cylindrical pin portion 201a and a gear portion 201b formed on an outer periphery of the lower portion of the pin portion 201a, as shown in FIG. 15. An upper end portion of the pin portion 201a is notched so as to form an opening portion 201d, thereby forming a structure for simply supporting the plate-like part (for example, the wafer) 1. Accordingly, by using transferring means (not shown) such as a robot hand or the like, it is possible to easily transfer in and out the plate-like part 1 from the opening portion (notched portion) 201d of the chuck pin 201. In this case, in order to support the outer peripheral portion of the plate-like part 1 by the chuck pin 201, each of the chuck pins 201 may be rotated (on its axis) so as to fix the outer peripheral portion of the plate-like part 1 to the taper chuck groove 201c.

The outer wheel 203 and the inner wheel 204 is structured such as to freely rotate around the supporting shaft 138 and forms a cylindrical shape around the center axis of the supporting shaft 138 (the axis of revolution of the chuck pin 201), as shown in FIGS. 3 and 5. In a plurality of portions (for example, three portions at 120 degrees interval) on the inner peripheral surface of the outer wheel 203, a circular arc-shaped groove (a recess portion) 202 to which a part (a substantially half portion) of a gear outer shape portion (a cylindrical portion) of each of the chuck pins 201 is provided. Accordingly, each of the chuck pins 201 is vertically slid along the circular arc-shaped groove (the recess portion) 202 formed at a plurality of portions on the inner peripheral surface of the outer wheel 203 together with a vertical motion of the inner wheel 204. Further, since the gear portion 201b of each of the chuck pin 201 is engaged (meshed) with a gear 205 of the inner wheel 204, each of the chuck pins 201 rotates due to the rotation of the inner wheel 204 so as to remove the outer periphery of the plate-like part 1 from the chuck groove 201c or fit it to the chuck groove 201c.

The outer wheel hood (the coating member) 208 is formed in a substantially cylindrical shape around the supporting shaft 138 as mentioned above so as to coat the periphery of the outer peripheral edge of the plate-like part 1 at a time of being chucked by the chuck pin 201 and cleaned. Since the outer wheel hood 208 is fixed to the upper portion of the outer wheel 203 by a plurality of connecting pins 207 as mentioned above, it rotates together with the outer wheel 203 when the outer wheel 203 rotates around the supporting shaft 138. Then, the waste liquid discharged from the outer periphery of the plate-like part 1 is recovered to the gas and liquid recovery unit 260 through the flow passage 209 formed between the upper portion of the outer wheel 203 and the outer wheel hood 208.

The inner wheel drive system 230 corresponds to a drive system for vertically moving and rotating a plurality of chuck pins 201 so as to attach and detach the plate-like part 1 with respect to the chuck pin 201, and as shown in FIGS. 4 and 6, is provided with an inner wheel holding hollow shaft 231 in which the inner wheel 204 is fixed to an upper end portion, a cam follower 232 which is fixed to the inner wheel holding hollow shaft 231 by a fixing screw 233, a rotating plate 234 with a gear which is fixed to a lower end portion of the inner wheel holding hollow shaft 231, a clutch gear 235 which keeps an engaging state and a disengaging state with respect to the rotating plate 234 with the gear, an inner wheel rotating motor 237 which rotates the clutch gear 235, a reduction gear which reduces a speed of rotation of the inner wheel rotating motor 237, a thrust bearing 238 which rotatably supports the rotating plate 234 with the gear from the upper and lower portions, an upper ring 239 and a lower ring 240 which grip the thrust bearing 238 from the upper and lower portions, a hollow cylindrical spacer 245 which keeps an interval between the upper ring 239 and the lower ring 240, a connecting pin 246 which extends through the upper ring 239 and the lower ring 240 with passing through the hollow cylindrical spacer 245, a screw 247 which prevents the upper ring 239 and the lower ring 240 from removing from the connecting pin 246, a vertically moving cylinder 242 which vertically moves the upper ring 239 and the lower ring 240, a fixing screw 241 for connecting a drive end of the vertically moving cylinder 242 to the lower ring 240, and a spacer 243 for adjusting a mounting level of the vertically moving cylinder 242 with respect to the casing 2.

The inner wheel holding hollow shaft 231 has a pipe portion having an inner diameter larger than an outer diameter of the supporting shaft 138, and a flange portion formed at an upper end of the pipe portion. The inner wheel 204 is fixed to the flange portion. The cam follower 232 is fixed to an outer periphery of the pipe portion of the inner wheel holding hollow shaft 231 by the fixing screw 233. The rotating plate 234 with the gear is fixed to a lower end portion of the pipe portion of the inner wheel holding hollow shaft 231. As mentioned above, the cam follower 232 fixed to the inner wheel holding hollow shaft 231 is engaged with a lower bearing inner wheel holding member 216 which is fixed to the lower end of the outer wheel holding hollow shaft 211 fixing the outer wheel 203 to the flange portion when descending the inner wheel holding hollow shaft 231 to a lower end position by the vertically moving cylinder 242, and the inner wheel 204 fixed to the flange portion of the inner wheel holding hollow shaft 231 is integrally rotated with the outer wheel 203 fixed to the flange portion of the outer wheel holding hollow shaft 211 which is rotated by the outer wheel rotating hollow motor 219.

The rotating disc 234 with the gear is supported by the thrust bearing 238 which is mounted to the upper and lower rings 239 and 240 so as to relatively rotate and relatively move in upper and lower directions. Accordingly, when the drive output end of the vertically moving cylinder 242 vertically moves and the upper and lower rings 239 and 240 connected to the drive output end vertically move, the rotating disc 234 with the gear also vertically moves, as a result, the inner wheel 204 vertically moves through the inner wheel holding hollow shaft 231 and a plurality of chuck pins 201 nipped between the inner wheel 204 are vertically move. When driving the vertically moving cylinder 242 so as to ascend the rotating disc 234 with the gear, the inner wheel holding hollow shaft 231 and the like and position at the upper end position, as shown in FIG. 4, the rotating disc 234 with the gear and the clutch gear 235 become in an engaging state, and when driving the inner wheel rotating motor 237 so as to rotate the clutch gear 235, the rotating disc 234 with the gear also rotates, as a result, the inner wheel holding hollow shaft 231, the inner wheel 204 and the like rotate around the supporting shaft 138, and a plurality of chuck pins 201 rotate (on their axis) due to an engagement between the gear 205 formed on the outer periphery of the upper end of the inner wheel 204 and the gear 201b of the chuck pin 201, thereby making it possible to release the plate-like part 1 from the taper-shaped chuck groove 201c and fit it thereto. In this case, when driving the inner rotating motor 237 so as to rotate the inner wheel 204 and rotate a plurality of chuck pins 201, it is necessary to operate the outer wheel stopping unit 270 so as to bring it into contact with the flange portion of the outer wheel holding hollow shaft 211, thereby preventing the outer wheel 203 from rotating. Accordingly, each of the chuck pins 201 rotates (on its axis) within the circular groove (the recess portion) 202 formed at a plurality of portions on the inner periphery of the outer wheel 203 in a state that the outer wheel 203 is stopped, thereby fitting the outer periphery of the plate-like part 1 to the taper-like chuck groove 201c or releasing it therefrom so as to be attached thereto and detached therefrom.

In this case, when driving the vertically moving cylinder 242 so as to descend the rotating disc 234 with the gear, the inner wheel holding hollow shaft 231 and the like, whereby the rotating disc 234 with the gear, the inner wheel holding hollow shaft 231 and the like are positioned at the lower end position, as shown in FIG. 4, the rotating disc 234 with the gear and the clutch gear 235 are in a disengaging state, so that even when driving the inner wheel rotating motor 237 so as to rotate the clutch gear 235, the rotating disc 234 with the gear, the inner wheel holding hollow shaft 231 and the inner wheel 204 do not rotate.

The outer wheel drive system 210 is, as shown in FIGS. 4 and 6, provided with the outer wheel holding hollow shaft 211 in which the outer wheel 203 is fixed to the upper end portion, an outer wheel liquid stopper 212 which is fixed to an inner peripheral side of the outer wheel 203 and the upper end portion of the outer wheel holding hollow shaft 211, upper and lower bearings 213 and 215 which support the outer wheel holding hollow shaft 211 so as to freely rotate around the supporting shaft 138, an upper bearing holding member 214, a lower bearing inner wheel holding member 216 which is fixed to the lower end of the outer wheel holding hollow shaft 211, a lower bearing outer wheel holding member 218, a seal 217, an outer wheel rotating hollow motor 219 which rotates the outer wheel holding hollow shaft 211 around the supporting shaft 138, and a rotating disc 220 on which a plurality of slits are formed.

The outer wheel holding hollow shaft 211 has a pipe portion having an inner diameter substantially equal to an outer diameter of the pipe portion of the inner wheel holding hollow shaft 231, and a flange portion which is formed in an upper end portion of the pipe portion. Slide bearings 244 are respectively formed on the inner peripheral surface of the pipe portion of the outer wheel holding hollow shaft 211 and the outer peripheral surface of the pipe portion of the inner wheel holding hollow shaft 231, are brought into contact with each other, and are structured such that the inner wheel holding hollow shaft 231 can smoothly perform the relative vertical motion and the relative rotation with respect to the outer wheel holding hollow shaft 211. The outer wheel 203 and the outer wheel liquid stopper 212 are fixed to the flange portion. The inner wheel of the upper bearing 213 is fixed to the upper end portion of the pipe portion of the outer wheel holding hollow shaft 211, and the outer wheel thereof is fixed to the upper bearing holding member 214. The upper bearing holding member 214 is fixed to a chassis 251 mentioned below. Further, the inner wheel of the lower bearing 215 is fixed to the lower bearing inner wheel holding member 216, and the outer wheel of the lower bearing 215 is fixed to the lower bearing outer wheel holding member 218. The lower bearing inner wheel holding member 216 is fixed to the lower end of the pipe portion of the outer wheel holding hollow shaft 211, and the lower bearing outer wheel holding member 218 is fixed to the chassis 251. The seal 217 is arranged between the lower bearing inner wheel holding member 216 and the lower bearing outer wheel holding member 218.

The cam groove to which the cam follower 232 extending through the lower bearing inner wheel holding member 216 from the side of the inner periphery to the side of the outer periphery and fixed to the inner wheel holding hollow shaft 231 can be slidably fitted is formed in the lower bearing inner wheel holding member 216 fixed to the lower end of the pipe portion of the outer wheel holding hollow shaft 211. The cam groove and the cam follower 232 is structured such as to limit an angle of relative rotation and an amount of relative thrust motion in a vertical direction between the outer wheel 203 and the outer wheel holding hollow shaft 211 and between the inner wheel 204 and the inner wheel holding hollow shaft 231.

The outer wheel rotating hollow motor 219 is arranged between the upper and lower bearing 213 and 215. The hollow motor 219 is constituted by a stator 219b formed in a cylindrical shape around the supporting shaft 138 and mounting a coil 219c an outer peripheral of which is mounted within a chassis 251, and a rotor 219a formed in a cylindrical shape around the supporting shaft 138 in the same manner, arranged in the inner peripheral side of the stator 219b and fixed to the pipe portion of the outer wheel holding hollow shaft 211. The outer wheel 203 fixed to the outer wheel holding hollow shaft 211 is rotated around the supporting shaft 138 together with the inner wheel 204 in accordance that the outer wheel rotating hollow motor 219 is driven. That is, the outer wheel rotating hollow motor 219 corresponds to a drive source for rotating the plate-like part (for example, the wafer) 1 supported within a fine gap between the upper cleaning plate 101 and the lower cleaning plate 121 by a plurality of chuck pins 201 at a high speed so as to perform a uniform cleaning all around the whole surface of the upper surface and the lower surface of the plate-like part 1.

The rotating disc 220 is fixed to the lower bearing inner wheel holding member 216 by the fixing screw 221. The rotating disc 220 is employed for detecting an angle of rotation of the outer wheel 203 as mentioned below.

The chassis unit 250 is provided with a chassis 251 formed in a cylindrical shape and having a size sufficient for covering the vertically moving cylinder 242, the inner wheel rotating motor 237 and the like, three rotary sensors 252 for detecting an angle of rotation of the outer wheel 203, a sensor plate 253 formed in a disc shape around the supporting shaft 138 and having a lower surface on which a plurality of rotary sensors 252 are mounted, a fixing screw 254 which fixes the sensor plate 253 to the chassis 251, and a cover 255 which covers a side opening portion of the chassis 251, as shown in FIGS. 4 and 6.

The rotary sensor 252 is a photo interrupt sensor which has a light emitting device and a light receiving device, and the light emitting device and the light receiving device are arranged with nipping a multiplicity of slits formed in the rotating disc 220 therebetween. Three rotary sensors 252 comprising an A-phase sensor and a B-phase sensor for detecting the rotation due to a phase difference detection and a Z-phase sensor for detecting an original point of the angle are fixed to the sensor plate 253. The sensor plate 253 is fixed to the chassis 251 so as to freely adjust the position thereof. The rotary sensor 252 is provided for detecting an angle of rotation, a speed of rotation and the like of a plurality of chuck pins 201 which support the outer wheel holding hollow shaft 211 and the outer wheel 203, that is, the plate-like part 1. Then, a signal from the rotary sensor 252 is transmitted to a servo control unit (not shown), which servo controls the outer wheel rotating hollow motor 219.

As mentioned above, the structure is made such as to detect stationary positions of rotation (original positions of angle) of a plurality of chuck pins 201 by the rotary sensor 252 because the portion is not engaged with a plurality of chuck pins 201 in a relation that a notch for alignment is formed in the plate-like part 1 when ascending and opening the upper cleaning unit 100 and transferring a plate-like part 1 to be newly cleaned by transferring means (not shown) such as a robot hand or the like. That is, because it is necessary to stand still a plurality of chuck pins 201 so that the notch for alignment in the plate-like part 1 is positioned between a plurality of chuck pins 201 when transferring the plate-like part 1. Further, the speed of rotation of the plate-like part 1 which is supported by a plurality of chuck pins 201 is detected from the rotary sensor 252, and as a result, the plate-like part 1 is rotated and controlled at a desired speed of rotation by the outer wheel rotating hollow motor 219.

Figure 7:
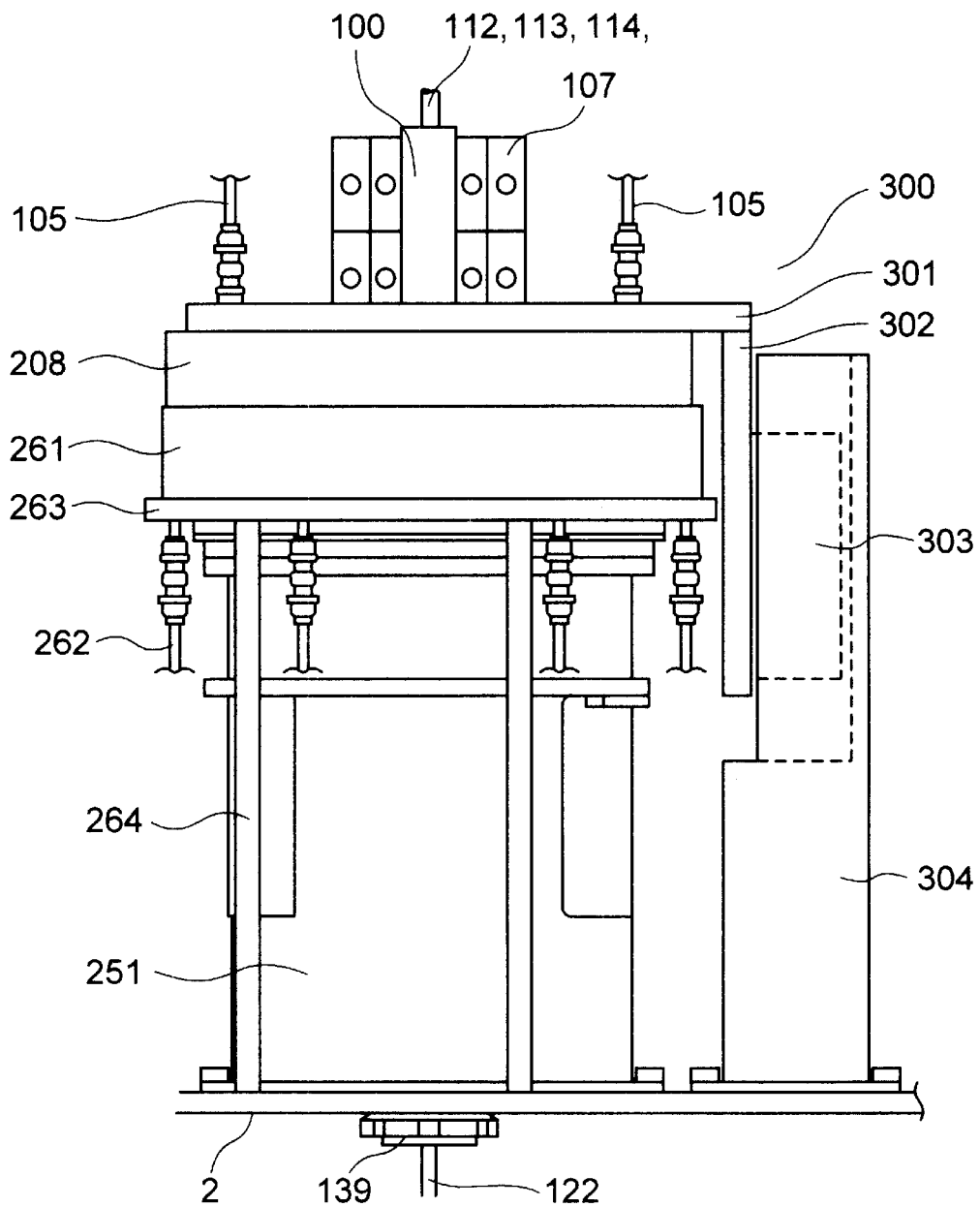
FIG. 7 is a side elevational view which shows an embodiment of a cleaning apparatus for a plate-like part in accordance with the present invention.

The gas and liquid recovery unit 260 is constituted by a tub 261 which is formed in a cylindrical shape and connected to the outer wheel hood 208 so as to relatively rotate, and a plurality of gas and liquid recovery pipes 262 which is connected to the tub 261, as shown in FIGS. 3 and 5. The cylindrical tub 261 is structured such that an upper end surface thereof is formed in a slidably contact surface with the rotating outer wheel hood 208 and a groove to which the waste fluid from the inner portion of the outer wheel hood 208 flows downward from the upper end surface is formed. The groove is formed in a wave shape in which a depth of the groove is changed in a peripheral direction. The gas and liquid recovery pipes 262 to which the waste fluid stored within the groove flows are connected to the deepest position of the groove in the tub 261. As shown in FIG. 7, the tub 261 is fixed to a tub supporting metal fitting 263. The tub supporting metal fitting 263 is fixed to the casing 2 by a plurality of supporting columns 264. Accordingly, the tub 261 constituting the gas and liquid recovery unit 260 and the gas and liquid recovery pipes 262 connected thereto are not rotated and in a standstill state.

Figure 8:
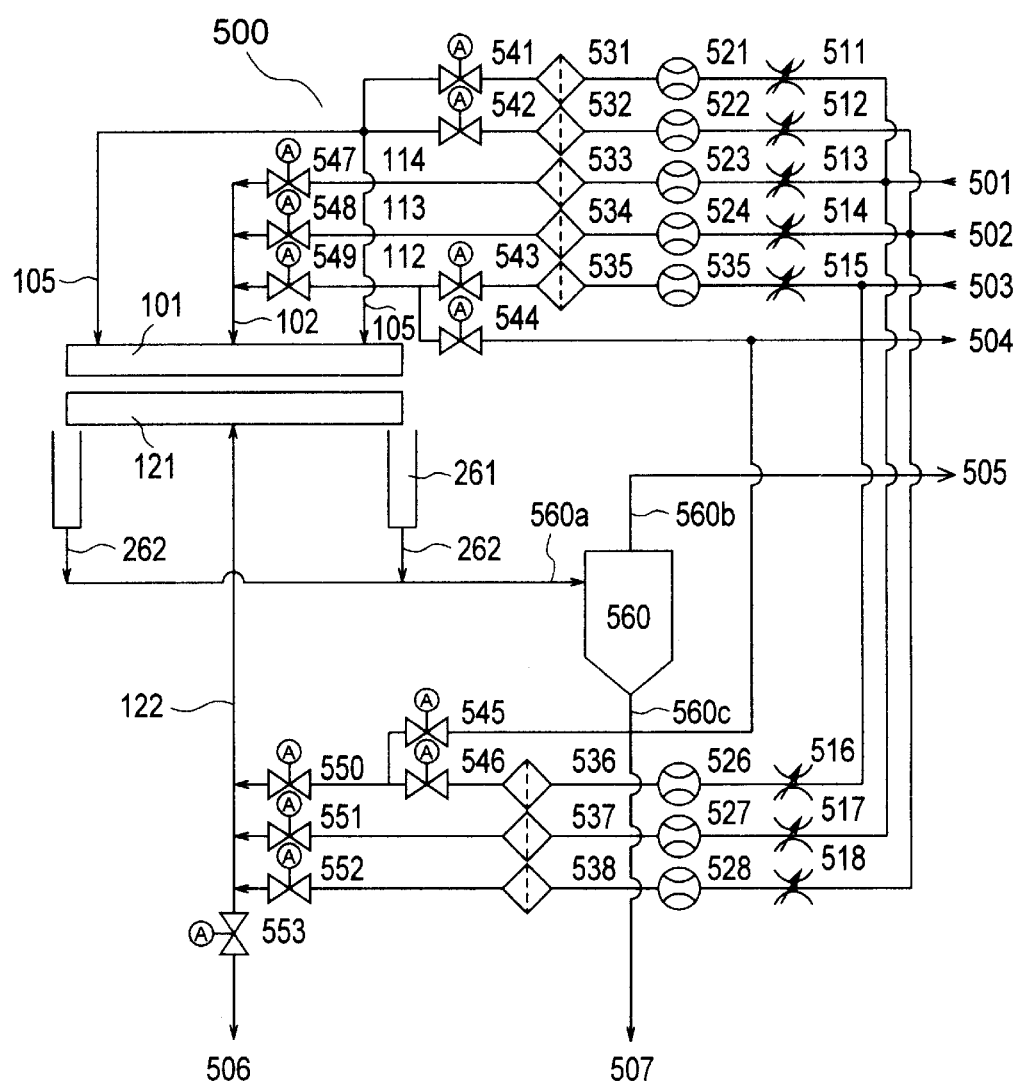
FIG. 8 is a systematic view which shows a treating fluid supplying unit and a gas and liquid recovery unit in an embodiment of a cleaning apparatus for a plate-like part in accordance with the present invention.

The gas and liquid recovery unit 260 is further provided with a cyclone type gas and liquid separator 560 which separates the gas and the liquid from the waste liquid discharged from the gas and liquid recovery pipe 262, and a vacuum pump (suction means) 505 which vacuum sucks the gas and liquid recovery line, as shown in FIG. 8.

The cyclone type gas and liquid separator 560 is constituted by a waste liquid inlet port 560a, a gas discharge port 560b and a waste liquid discharge port 560c. A plurality of gas and liquid recovery pipes 262 are united and connected to the waste liquid inlet port 560a of the cyclone type gas and liquid separator 560. The vacuum pump 505 is connected to the gas discharge port 560b. Further, a waste liquid discharge line 507 is connected to the waster liquid discharge port 560c. A waste liquid treatment equipment (not shown) is provided in front of the waste liquid discharge line 507.

The treating fluid supplying unit 500 is constituted by a dry nitrogen supplying system which supplies a dry nitrogen from a dry nitrogen supplying portion 501, a pure water supplying system which supplies a pure water from the pure water supplying portion 502, a chemical liquid supplying system which supplies a chemical liquid from a chemical liquid supplying portion 503, and a chemical liquid recovery system which returns the chemical liquid in the chemical liquid supplying system to a chemical liquid recovery portion 504, as shown in FIG. 8.

Both of the dry nitrogen supplying system and the pure water supplying system are further separated into three systems comprising an upper cleaning plate center supplying system, an upper cleaning plate periphery supplying system and a lower cleaning plate supplying system. In the respective three systems of the dry nitrogen supplying system connected to the dry nitrogen supplying portion 501, there are provided throttle valves 511, 513 and 517, flow amount meter 521, 523 and 527, filters 531, 533 and 537, and air drive partition valves 541, 547 and 551. Further, in the respective three pure water supplying systems connected to the pure water supplying portion 502, there are provided throttle valves 512, 514 and 518, flow amount meter 522, 524 and 528, filters 532, 534 and 538, and air drive partition valves 542, 548 and 552.

Further, the chemical liquid supplying system is further separated into two systems comprising an upper cleaning plate center supplying system and a lower cleaning plate supplying system. In the respective two systems of the chemical liquid supplying system connected to the chemical liquid supplying portion 503, there are provided throttle valves 515 and 516, flow amount meter 525 and 526, filters 535 and 536, first air drive partition valves 543 and 546, and second air drive partition valves 549 and 550.

The chemical liquid recovery system is constituted by two systems comprising an upper chemical liquid recovery system which is branched from a portion between the first air drive partition valve 543 and the second air drive partition valve 549 in the upper cleaning plate center supplying system of the chemical liquid supplying system, and a lower chemical liquid recovery system which is branched from a portion between the first air drive partition valve 546 and the second air drive partition valve 550 in the lower cleaning plate supplying system of the chemical liquid supplying system. The air drive partition valves 544 and 545 are respectively provided in the two systems of the chemical liquid recovery system.

Three air drive partition valves 547, 548 and 549 in the upper cleaning plate center supplying system are connected to the upper introducing pipe 102 of the upper cleaning unit 100. Two air drive partition valves 541 and 542 in the upper cleaning plate peripheral supplying system are connected to the upper peripheral introducing pipe 105 of the upper cleaning unit 100. In this case, three air drive partition valves 547, 548 and 549 in the upper cleaning plate center supplying system constitute the valve unit 107 of the upper cleaning unit 100. Three air drive partition valves 550, 551 and 552 in the lower cleaning plate supplying system are connected to the lower introducing pipe 122 of the lower cleaning unit 120. Since three air drive partition valves 550, 551 and 552 in the lower cleaning plate supplying system can not be directly provided on the upper cleaning plate 101 as is different from the valve unit 107 (547, 548 and 549) of the upper cleaning unit 100, the lower introducing pipe 122 becomes long. Accordingly, a lot of fluid before switching between the gas and the liquid exists within the lower introducing pipe 122 after switching between the gas and the liquid. Accordingly, in this embodiment, in order to remove the remaining fluid within the lower introducing pipe 122, a suck back line 506 is provided in the lower introducing pipe 122 via the air drive partition valve 553.

The vertical drive unit 300 is structured such as to vertically move and open and close the upper cleaning unit 100 so as to transfer in and out the plate-like part 1 with respect to a plurality of chuck pins 201 by using the transfer means (not shown) such as the robot hand or the like, and as shown in FIG. 7, is provided with a cleaning plate fixing beam 301 to which the upper cleaning plate 101 of the upper cleaning unit 100 is fixed, and a vertically moving table 303 which vertically moves the upper cleaning unit 100 together with the cleaning plate fixing beam 301. In this case, the vertically moving table 303 is fixed to the casing 2.

As mentioned above, in order to transfer in and out the plate-like part (for example, the wafer) 1 on the lower cleaning plate 121 by using the transfer means (not shown) such as the robot hand or the like, thereby attaching and detaching the outer periphery of the plate-like part 1 with respect to the chuck members (the chuck pins) 201, the vertical drive unit 300 is operated so as to ascend and open the upper cleaning unit 100, and next the vertically moving cylinder 242 is operated so as to ascend the inner wheel 204 via the inner wheel holding hollow shaft 231, thereby ascending a plurality of chuck members (the chuck pins) 201 nipped between the inner wheels 204 at the upper and lower portions. Next, the inner wheel rotating motor 237 is driven so as to rotate the inner wheel 204 via the inner wheel holding hollow shaft 231 in a state of operating the outer wheel stopping unit 270 so as to stop the outer wheel 203, and the gear 205 formed on the outer periphery of the upper end of the inner wheel 204 and the gear 201b formed on each of the chuck pins 201 are meshed with each other, whereby each of the chuck pins 201 rotates (on its axis) within the circular arc grooves 202 formed in a plurality of portions of the inner periphery of the outer wheel 203 so as to make it possible to attach and detach the outer periphery of the plate-like part 1 which is transferred in and out.

Since the plate-like part 1 is lifted up from the lower cleaning plate 121 by the chuck pins 201 when transferring out the plate-like part 1, it is possible to grip the plate-like part 1 by the transfer means such as the robot hand or the like, and further, since the outer periphery of the plate-like part 1 is removed from the chuck pins 201 due to the rotation of the chuck pins 201, it is possible to outward transfer out the plate-like part 1 by the transfer means such as the robot hand or the like. Further, when transferring in the plate-like part 1, an inverse operation to the operation at a time of transferring out the plate-like part 1 is performed. That is, the plate-like part 1 is transferred in above the lower cleaning plate 121 by the transfer means such as the robot hand or the like, and next, the outer periphery of the plate-like part 1 is gripped (supported) due to the rotation of the chuck pins 201. Next, by escaping the transfer means such as the robot hand or the like, operating the vertically moving cylinder 242 so as to descend the inner wheel 204 via the inner wheel holding hollow shaft 231, and descending a plurality of chuck members (the chuck pins) 201 in which the upper and lower portions are nipped between the inner wheels 204, the lower surface of the plate-like part 1 is attached to the position near the lower cleaning plate 121 (the position in which the fine gap is formed). Thereafter, by operating the vertical drive unit 300 so as to descend the upper cleaning unit 100, the upper surface of the plate-like part 1 is also attached to the position near the upper cleaning plate 101 (the position in which the fine gap is formed), whereby the plate-like part 1 becomes in a state of being cleaned.

Next, by driving and controlling the outer wheel rotating hollow motor 219 on the basis of the signal detected by the rotary sensor 252, the outer wheel 203 is rotated at a desired speed of rotation together with the inner wheel 204, and a plurality of chuck pins 201 fixed to the outer wheel 203 is rotated (revolved), thereby rotating the plate-like part 1 at a desired speed of rotation, for example, in a range between 50 and 200 rpm. Next, at first, the first air drive partition valve 543 is opened, subsequently the second air drive partition valve 549 is opened so as to inject the chemical liquid from the upper main injecting port 103 and the upper auxiliary injecting port 104 to the center of the upper surface of the rotating plate-like part 1 through the upper introducing pipe 102 of the upper cleaning unit 100, and the chemical liquid attached due to the surface tension is radially flown from the center to the outer periphery due to the centrifugal force, thereby peeling the dusts attached on the upper surface of the plate-like part 1 while dissolving so as to perform the cleaning operation. At the same time, at first, the first air drive partition valve 546 is opened, subsequently the second air drive partition valve 550 is opened so as to inject the chemical liquid from the lower main injecting port 123 and the lower auxiliary injecting port 124 to the center of the lower surface of the rotating plate-like part 1 through the lower introducing pipe 122 of the lower cleaning unit 120, and the chemical liquid attached due to the surface tension is radially flown from the center to the outer periphery due to the centrifugal force, thereby peeling the dusts attached on the lower surface of the plate-like part 1 while dissolving so as to perform the cleaning operation. An amount of the chemical liquid supplied from the chemical liquid supplying portion 503 is about 0.5 to 2 litter/min. Further, a time for flowing the chemical liquid to the upper surface and the lower surface of the plate-like part 1 is about 10 seconds to 10 minutes. In a word, it varies with the kind of the chemical liquid.

In this case, the cleaning by the chemical liquid is finished by opening the air drive partition valve 544 while closing the second air drive partition valve 543 so as to close the first air drive partition valve 543 while recovering the chemical liquid and simultaneously opening the air drive partition valve 545 while closing the second air drive partition valve 550 so as to close the first air drive partition valve 546 while recovering the chemical liquid.

Next, the air drive partition valve 548 is opened so as to inject the pure water from the upper main injecting port 103 and the upper auxiliary injecting port 104 to the center of the upper surface of the rotating plate-like part 1 through the upper introducing pipe 102 of the upper cleaning unit 100, and the pure water attached due to the surface tension is radially flown from the center to the outer periphery due to the centrifugal force so as to flow and clean the chemical liquid left on the upper surface of the plate-like part 1, and simultaneously the air drive partition valve 542 is opened so as to inject the pure water from the upper peripheral injecting port 106 to the periphery of the upper surface of the rotating plate-like part 1 through the upper peripheral introducing pipe 105 of the upper cleaning unit 100, thereby cleaning the chemical liquid left in the periphery. At the same time, the air drive partition valve 552 is opened so as to inject the pure water from the lower main injecting port 123 and the lower auxiliary injecting port 124 to the center of the lower surface of the rotating plate-like part 1 through the lower introducing pipe 122 of the lower cleaning unit 120, and the pure water attached due to the surface tension is radially flown from the center to the outer periphery due to the centrifugal force so as to clean the chemical liquid left on the lower surface of the plate-like part 1. An amount of the pure water supplied from the pure water supplying portion 502 is about 1 to 2 litter/min. Further, a time for flowing the pure water to the upper surface and the lower surface of the plate-like part 1 is about 10 to 100 seconds.

In this case, the cleaning operation by the pure water is finished by closing the air drive partition valves 548 and 542 and the air drive partition valve 552.

Next, the air drive partition valve 547 is opened so as to inject the dry nitrogen from the upper main injecting port 103 and the upper auxiliary injecting port 104 to the center of the upper surface of the rotating plate-like part 1 through the upper introducing pipe 102 of the upper cleaning unit 100, and the dry nitrogen is radially flown from the center to the outer periphery so as to dry the upper surface of the plate-like part 1, and simultaneously the air drive partition valve 541 is opened so as to inject the dry nitrogen from the upper peripheral injecting port 106 to the periphery of the upper surface of the rotating plate-like part 1 through the upper peripheral introducing pipe 105 of the upper cleaning unit 100, thereby securely drying the periphery. At the same time, the air drive partition valve 551 is opened so as to inject the dry nitrogen from the lower main injecting port 123 and the lower auxiliary injecting port 124 to the center of the lower surface of the rotating plate-like part 1 through the lower introducing pipe 122 of the lower cleaning unit 120, and the dry nitrogen is radially flown from the center to the outer periphery so as to dry the lower surface of the plate-like part 1. In this case, the drying operation by the dry nitrogen is finished by closing the air drive partition valves 547 and 541 and the air drive partition valve 551.

Next, a description will be given of an embodiment for reducing the contamination, the damage and the unevenness of the treatment of the plate-like part caused by the amount of the charged electricity of the plate-like part at a time of cleaning the plate-like part 1 while rotating in the cleaning apparatus in accordance with the present invention.

Figure 9:
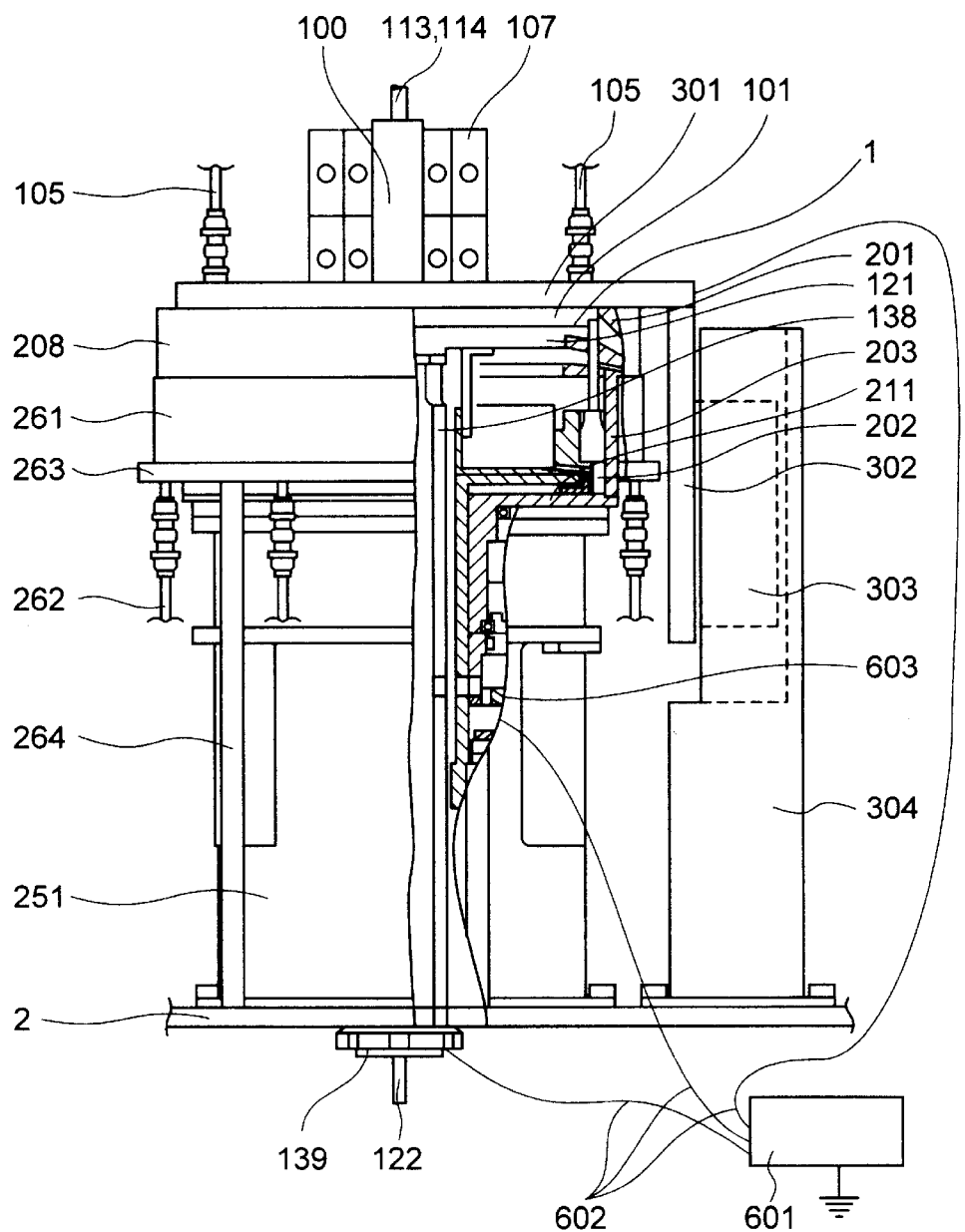
FIG. 9 is a block diagram which shows a first embodiment of potential difference applying means (electric potential control means) for reducing an electricity charging in a cleaning apparatus for a plate-like part in accordance with the present invention.

Here, as shown in FIG. 9, the upper cleaning plate 101, the lower cleaning plate 121, and the chuck pins 201 are respectively connected to a voltage control unit 601 via other members, thereby constituting the potential difference applying means which applies a desired potential difference between the plate-like part (for example, the wafer) 1 and the upper and lower cleaning plates 101 and 121.

The upper cleaning plate 101, the lower cleaning plate 121 and the chuck pin 201 are made of a fluorocarbon resin material having a chemical liquid resistance and including carbon, and has a little electric conductivity. The upper cleaning plate 101 is electrically connected to the stainless cleaning plate fixing beam 301 which is connected to the voltage control unit 601 by a double electrically conductive line 602. In the same manner, the lower cleaning plate 121 is electrically connected to the stainless supporting shaft 138 which is connected to the voltage control unit 601 by the double electrically conductive line 602. Further, in the same manner, the chuck pin 201 is connected to the voltage control unit 601 via the stainless outer wheel holding hollow shaft 211 having the outer wheel 203 made of a polyether ether ketone containing the carbon and having a little electric conductivity, by the double electrically conductive line 602 which is connected to a slip ring 603 mounted to the chassis 251 and electrically connected to the outer wheel holding hollow shaft 211. The voltage control unit 601 is grounded on the earth and serves to keep the electric potential of the upper cleaning plate 101, the lower cleaning plate 121 and the chuck pin 201 with respect to the earth to a desired value. In this case, the double electrically conductive line 602 is employed for reducing the change of the electric potential in the electrically conductive line, and the voltage is monitored by the voltage control unit 601.

In this case, the upper cleaning plate 101, the lower cleaning plate 121, the chuck pins 201 and the outer wheel 203 which correspond to the resin members containing the carbon so as to obtain a little electric conductivity and having the chemical liquid resistance are manufactured by a die molding without using a removing process such as a cutting process, a grinding process and the like, in order to prevent the wafer 1 from being contaminated due to the removal of the carbon powder from the surface. Because the carbon powder is hard to be exposed to the resin surface containing the carbon powder and manufactured by the die molding, thereby achieving a good characteristic.

In accordance with the structure mentioned above, since the plate-like part (for example, the wafer) 1 is energized by the operation of the voltage control unit 601 so that a desired potential difference is applied so as to cancel the always generated static electricity even in the state of being charged by the static electricity during cleaning, rinsing and drying, it is possible to avoid the problems such as the deterioration of the surface of the plate-like part (for example, the wafer) 1 due to the abnormal oxidation reaction or the like, the damage by a fire of the circuit on the plate-like part 1 due to the discharge phenomenon at a time of taking out the plate-like part (for example, the wafer) 1 after the process is finished, the foreign material contamination of the surface of the plate-like part 1 due to the suction of the dust in the ambient air during the transfer, and the like.

Figure 10:
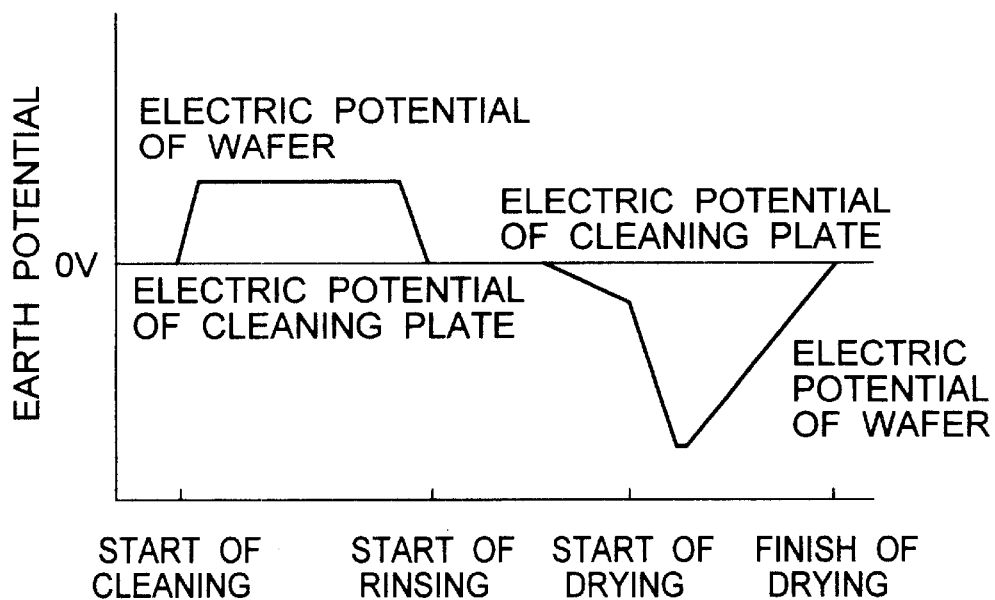
FIG. 10 is a view which shows change of the electric potential of upper and lower cleaning plates and the plate-like part in the first embodiment shown in FIG. 9.

More particular matters are as follows. In FIG. 10, at a time of cleaning by the chemicals (at a time of injecting the chemical liquid onto the upper surface and the lower surface of the plate-like part 1 so as to clean), the electric potential of the plate-like part (for example, the wafer) 1 is set to a little positive electric potential (about some V) in comparison with the upper and lower cleaning plates 101 and 121 via the chuck pin 201, thereby making the speed of the process (the cleaning process by the chemical liquid) of the plate-like part 1 during the cleaning high, the electric potential of the plate-like part 1 is kept 0 V (the ground level) at a beginning of the rinsing operation for injecting the pure water to the upper surface and the lower surface of the plate-like part 1, and the electric potential of the plate-like part 1 is gradually changed to the negative electric potential while the rinsing is proceeded and the chemical component is removed. Further, the electric potential of the plate-like part 1 is set to a greater negative electric potential (about 500 to 1000 V for removing oxygen) while injecting the dry nitrogen to the upper surface and the lower surface of the plate-like part 1 so as to start drying, thereby preventing the plate-like part 1 from oxidizing due to the reaction between the oxygen (about 10 to 100 ppm) mixed in the circumstance and the remaining water. Thereafter, in accordance that the water is removed, the electric potential of the plate-like part 1 is returned to the earth potential 0 V the same as that of the upper and lower cleaning plates 101 and 121 so as to remove the static electricity remaining in the plate-like part 1, whereby the cleaning is finished. In this case, the upper and lower cleaning plates 101 and 121 are maintained in the earth potential ($_0$ V). Further, since the interval between the upper and lower cleaning plates 101 and 121 and the plate-like part (for example, the wafer) 1 is about 1 mm which is enough narrow to obtain an effect of improving the cleaning capacity, a withstand electric potential becomes about 1000 V. Further, in the embodiment mentioned above, in order to achieve the high speed of the cleaning operation by the chemical liquid, the electric potential of the plate-like part (for example, the wafer) 1 is set to the slightly more positive electric potential (about some V) than that of the upper and lower cleaning plates 101 and 121, however, it is not always necessary to set the electric potential of the plate-like part 1 to the slightly more positive electric potential than that of the upper and lower cleaning plates 101 and 121.

That is, by setting the electric potential of the plate-like part 1 to the negative electric potential after the middle of the rinsing operation before the drying operation is started, it is possible to make the terminal end condition (the oxygen terminal end condition=thickness condition of the oxidation film) of the surface of the plate-like part 1 after the cleaning and drying operation to the minimum level. For example, in the case of a 256 M bit DRAM, it is necessary to set the thickness of the oxidation film to about 50 nm or less, and in the case of a 1 G bit DRAM, it is necessary to set it to about 20 to 30 nm or less. Accordingly, in the case of a DRAM of 256 M bit or more, it is rather possible to remove the oxygen and set the oxidation of the plate-like part 1 to about 50 nm or less by making the electric potential of the plate-like part 1 the greater negative electric potential after the middle of the rinsing operation before the drying operation is started.

As mentioned above, a description is given in detail of the first embodiment for preventing the electric charge in the cleaning apparatus in accordance with the present invention, however, in the other embodiments described below, the same operations and effects can be realized within a limitation.

Figure 11:
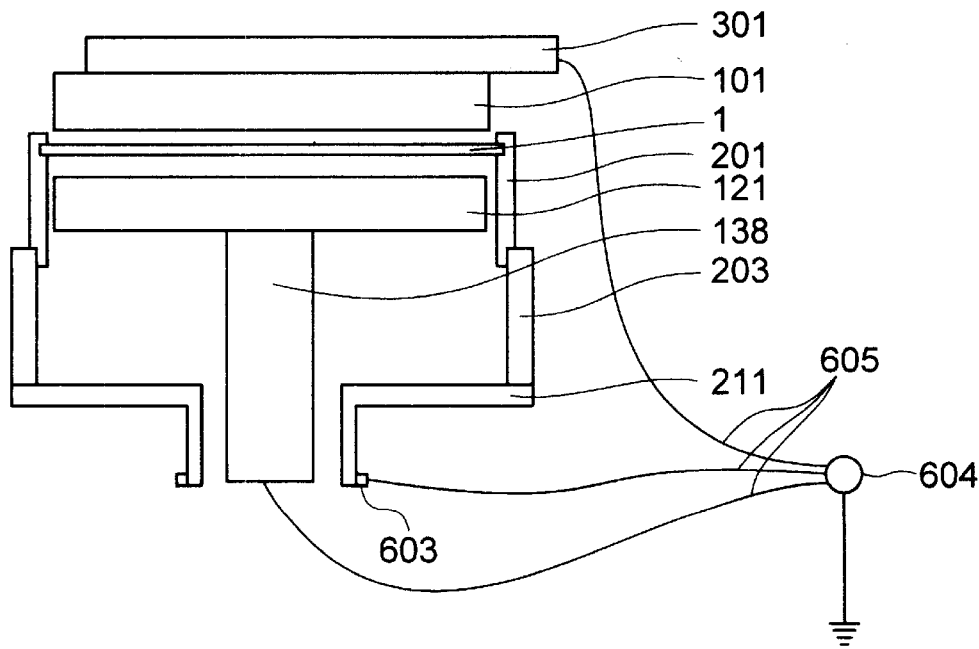
FIG. 11 is a block diagram which shows a second embodiment of potential difference applying means (electric potential control means) for reducing an electricity charging in a cleaning apparatus for a plate-like part in accordance with the present invention.

A second embodiment schematically shown in FIG. 11 is different from the first embodiment, in view that the voltage control unit 601 and the double electrically conductive line 602 are not used and a ground terminal 604 and an electrically conductive line 605 are simply used. In FIG. 11, the constituting elements other than the changing points mentioned above are expressed in an omitted manner. In the case of this second embodiment, the active electrical potential control which can be realized in the first embodiment is not realized, and the upper and lower cleaning plates 101 and 121 and the plate-like part (for example, the wafer) 1 are always kept the earth voltage 0 V. As mentioned above, even when setting the electric potential of the plate-like part 1 to the earth potential 0 V, the electric potential of the surface of the plate-like part 1 becomes a little negative with respect to the upper and lower cleaning plates 101 and 121 manufactured by the fluorocarbon resin material containing a little amount of carbon, so that it is possible to prevent the plate-like part 1 from abnormally oxidizing. In this second embodiment, since no voltage control unit 601 is used, a cost of the apparatus becomes inexpensive and there is an advantage of no risk of giving a bad influence to the plate-like part (for example, the wafer) 1 by carelessly setting the electric potential.

Further, as a third embodiment, it is possible to construct the upper and lower cleaning plates 101 and 121 by an insulating material (for example, a vinyl chloride resin) having a little positive characteristic (a negative electric potential of about 300 V or less) in a relative friction order with respect to the material of the plate-like part (for example, the wafer) 1, and construct the chuck pin 201 by an insulating material such as a pure fluorocarbon resin or the like.

Figure 12:
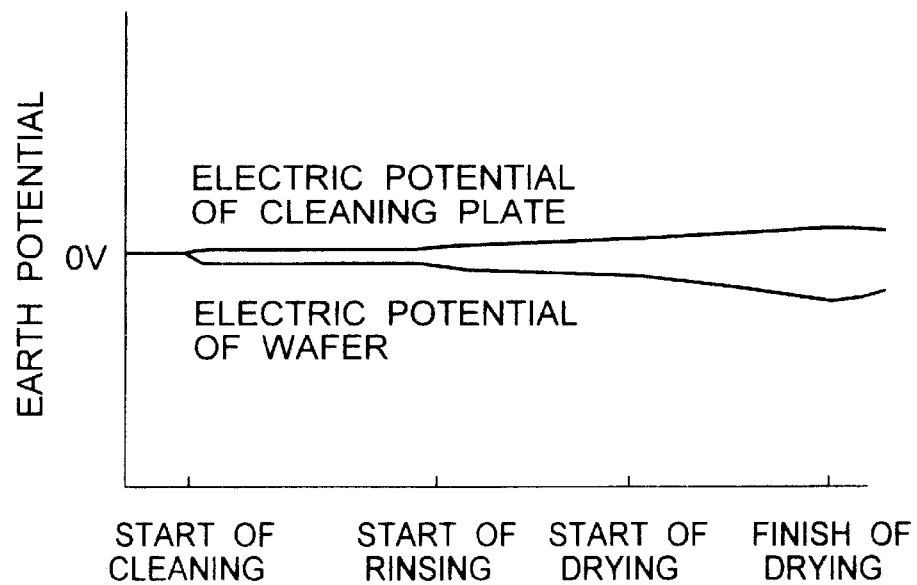
FIG. 12 is a view which shows change of the electric potential of upper and lower cleaning plates and the plate-like part in the second embodiment shown in FIG. 11.

In the case of this third embodiment, the electric potential of the plate-like part 1 and the upper and lower cleaning plates 101 and 121 is structured as shown in FIG. 12 such that the plate-like part 1 is charged to a negative potential due to the change of the earth potential and the upper and lower cleaning plates 101 and 121 are charged to a little positive potential. Particularly speaking, the plate-like part 1 is charged to a little negative potential at the same time when the plate-like part 1 starts rotating together with the cleaning operation, however, an amount of the electric charge is a level which can be ignored, due to an operation of ions in the cleaning liquid. Thereafter, the remaining ions in the liquid disappear together with the start of the rinsing operation, the plate-like part 1 is promoted to be charged, and the plate-like part 1 is largely charged to a negative potential when the number of rotation of the plate-like part 1 is increased together with the start of the drying operation. When the rotation of the plate-like part 1 is finished together with the completion of the drying operation, the electric charge of the plate-like part 1 and the upper and lower cleaning plates 101 and 121 is gradually removed.

In this third embodiment, since the electric charge of the plate-like part 1 and the upper and lower cleaning plates 101 and 121 is determined by a relation between the generation of the static electricity due to the friction and the diffusion and neutralization to the periphery, it is impossible to optionally set the electric potential at an optional time during the process, however, it is possible to prevent the plate-like part 1 from abnormally oxidizing during the drying operation (an abnormal terminal end condition after the cleaning and drying operation, and an abnormal oxygen terminal end condition), so that the electrically conductive resin material, the voltage control unit 601, the electrically conductive line and the like are not required, whereby there is an advantage of inexpensively realizing the apparatus.

A fourth embodiment is structured such that the upper and lower cleaning plates 101 and 121 are constituted by an insulating material (for example, a polystyrene) having a friction electric charge order similar to that of the plate-like part (for example, the wafer) 1, whereby it is possible to restrict the friction electric charge of the plate-like part 1 to a minimum limit. In the case of this fourth embodiment, it is impossible to realize a function of actively preventing the plate-like part 1 from abnormally oxidizing during the drying operation, however, it is possible to reduce the electric charge of the plate-like part 1, and it is possible to prevent the circuit from being deteriorated in accordance with the electric discharge at a time of taking out the plate-like part 1 from the cleaning apparatus and prevent the dusts from being absorbed at a time of taking out and transferring the plate-like part 1 from the cleaning apparatus.

Further, as a modified embodiment of the first to fourth embodiments mentioned above, it is possible to construct the upper cleaning plate 101 opposing to the upper surface of the plate-like part (for example, the wafer) 1 by a material having a more positive electric charge order than the plate-like part 1, and construct the lower cleaning plate 121 opposing to the lower surface of the plate-like part 1 by a material having a more negative electric charge than the plate-like part 1, thereby preventing the side of the upper surface of the plate-like part 1 from abnormally oxidizing at the cost of the oxidation of the side of the lower surface of the plate-like part 1 while preventing the whole of the plate-like part 1 from electrically charging. In the case of this modified embodiment, since the material having a risk of generating the foreign matters such as the resin material containing the carbon is not used, there is not generated a problem of deterioration due to an abrasion of the surface of the part, and there is an advantage that no abnormal oxidation in the side of the upper surface of the plate-like part 1 and no problem of the absorption of the foreign matters during the transfer are generated.

In the first embodiment mentioned above, the resin material containing the carbon is used for the upper cleaning plate 101, the lower cleaning plate 121 and the chuck pin 201, however, it is possible to realize by a metal material structured such that a fluorocarbon resin coating is applied to a chemical liquid exposure portion.

Figure 13A:
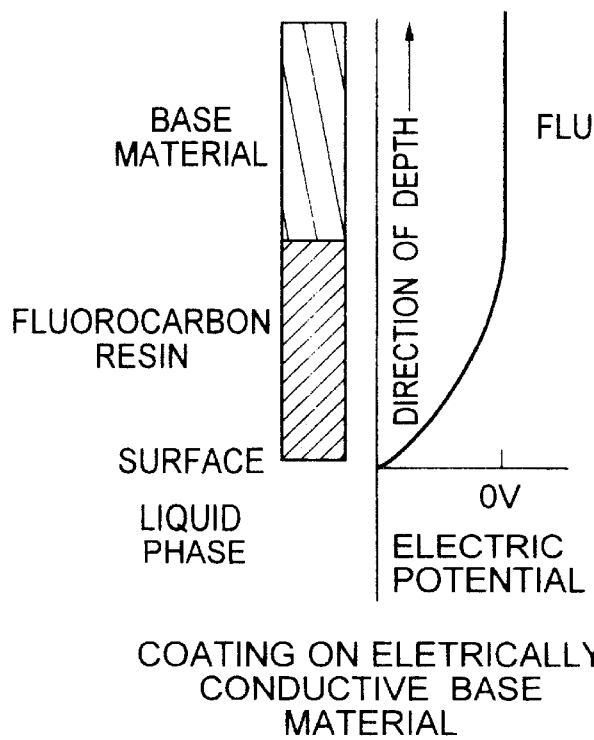
FIG. 13 is a comparative view which shows a relation between a material and an amount of charged electric of a closing member such as the cleaning plate or the like in accordance with the present invention.
Figure 13B:
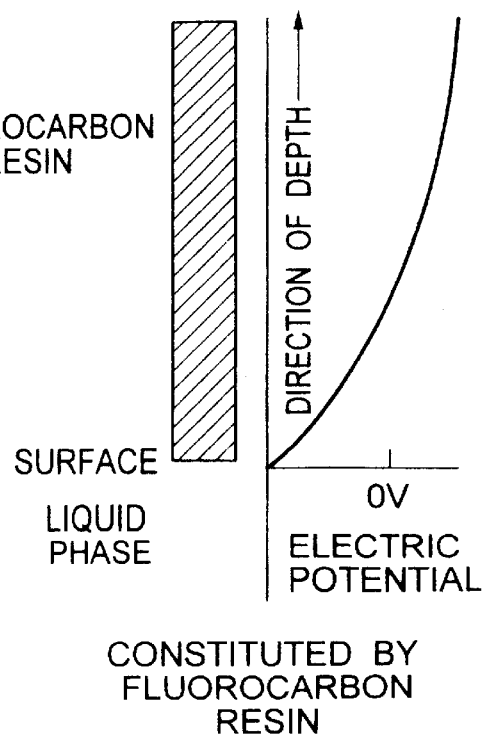

FIG. 13 exemplifies an electric charge near the surface of the material in this case. As shown in FIG. 13A, on the surface of the electrically conductive base material on which the fluorocarbon resin is thinly coated, there is a tendency of electrically charging to the negative potential in the same manner as the case of constructing the whole by the fluorocarbon resin. However, since the electrically conductive base material is contained in the inner portion thereof, the static electricity easily escapes, and in comparison with the case that the inner portion is made of the fluorocarbon resin as shown in FIG. 13B, an absolute value of the voltage of the surface is small. Actually, the opposite surface of the base material is grounded. Since this effect is hardly obtained when the thickness of the coating film is over some tens $\mu$m, it is necessary to set the thickness of the coating film to about some $\mu$m.

In this embodiment, a service life is reduced due to the abrasion of the coating film, however, there is an advantage that the chemical liquid used for the cleaning operation is hardly limited by using the fluorocarbon resin which is excellent in the chemical resistance for the liquid contact portion near the plate-like part 1.

Further, in the embodiment shown in FIG. 13, it is possible to combine the opposing surface of the base material so as to control the electric potential in the same manner as that of the first embodiment. In this case, there is an advantage that the chemical liquid used for the cleaning operation is hardly limited by using the fluorocarbon resin which is excellent in the chemical resistance for the portion which is in contact with the chemical liquid and the electric potential state in the periphery of the plate-like part 1 can be optionally set.

Figure 14:
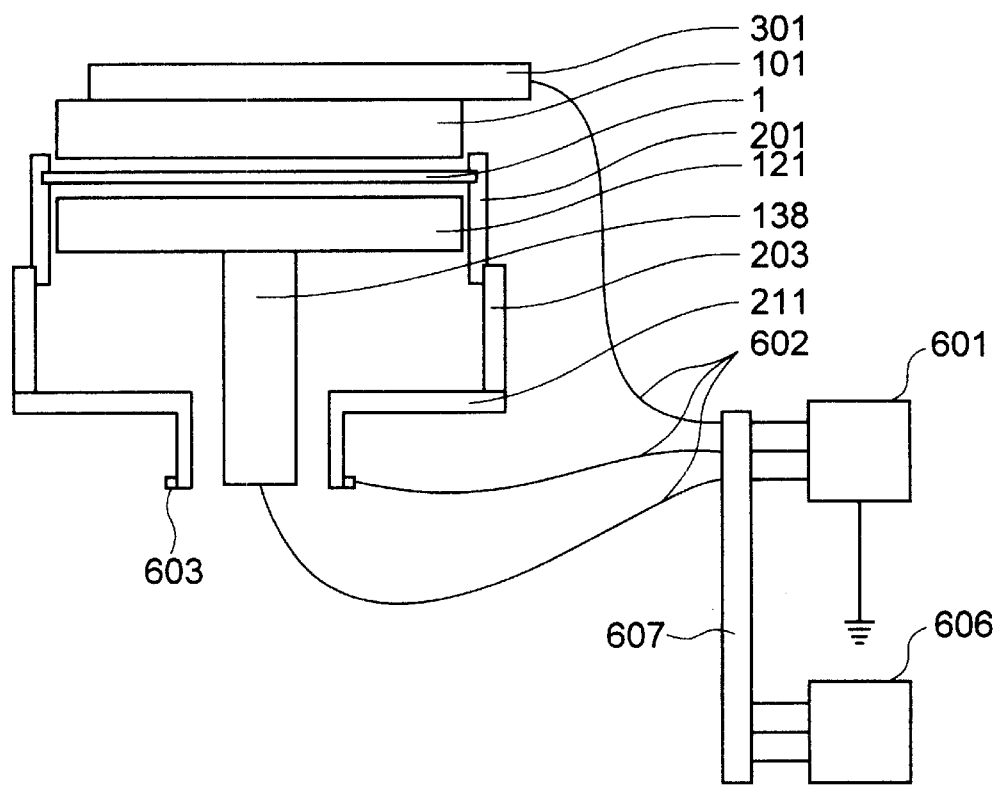
FIG. 14 is a block diagram which shows electric potential and electric current control means in the cleaning apparatus in accordance with the present invention.

In the first embodiment, the voltage control unit 601 is employed for controlling the electric charge of the plate-like part (for example, the wafer) 1, however, it is possible to more actively energize the plate-like part 1 and largely change the chemical reaction on the surface such as a plating. This structure is shown in FIG. 14. In this case, since it is necessary to supply a great current to the plate-like part 1, an electric current supply unit 606 used by being switched to the voltage control unit 601 is provided, and the voltage control unit 601 and the electric current supply unit 606 are alternately switched and used via a switching unit 607. Further, since it is necessary that a chuck pin 201' supplies a great current to a fine contact surface, as shown in FIG. 15, a platinum electrode 201a is provided in a portion which is brought into contact with the plate-like part (for example, the wafer) 1, a platinum wire 201b is inserted in the middle thereof, and a slip ring 201c is provided in a root portion. In accordance with the present embodiment, since the platinum is exposed to the surface, a limit is generated in the chemicals used for cleaning, however, there is an advantage of commonly executing a process which can not be realized by a normal cleaning process such as a plating process or the like.

In accordance with the present invention, since it is possible to control the charging amount of the static electricity of the plate-like part corresponding to the subject to be cleaned at a time of cleaning, rinsing and drying, there can be obtained effects of reducing an unevenness of the cleaning due to the abnormal reaction at a time of cleaning, preventing the abnormal oxidation at a time of rinsing and drying, preventing a damage applied to the fine pattern on the plate-like part due to the quick electric discharge at a time of taking out the plate-like part, preventing the absorption of the foreign matters in the circumstance at a time of transferring the plate-like part after the cleaning operation, and the like.

Further, in accordance with the present invention, it is possible to realize additional effects such as an acceleration of cleaning the plate-like part, and the like by actively changing the electric potential of the surface of the plate-like part during the cleaning operation.

Further, in accordance with the present invention, since it is possible to apply a stable great electric current to the plate-like part, there is an advantage that the plating process of the plate-like part and the cleaning process corresponding to the latter process thereof can be united.

Here, a description will be given of an embodiment in the case of applying the present invention to the cleaning apparatus.

Figure 16:
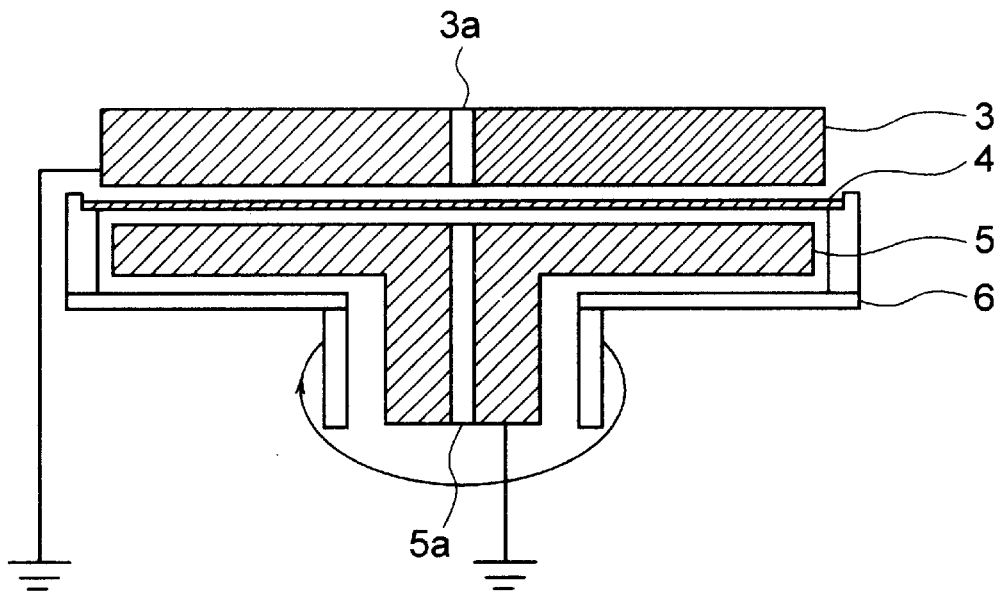
FIG. 16 is a schematic cross sectional view which shows a main portion of the apparatus in accordance with the present invention.
Figure 17:
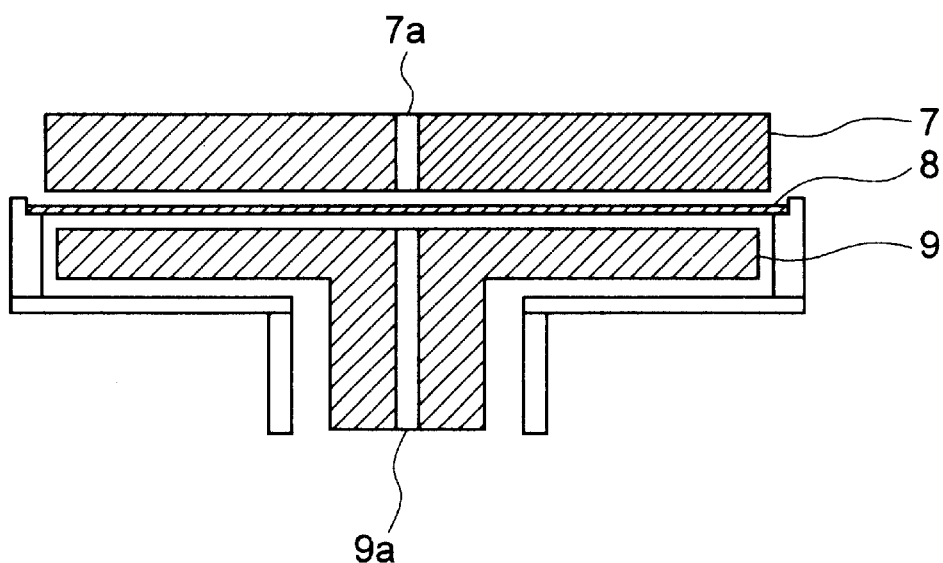
FIG. 17 is a schematic cross sectional view of a main portion of the apparatus in accordance with a conventional art.
Figure 18:
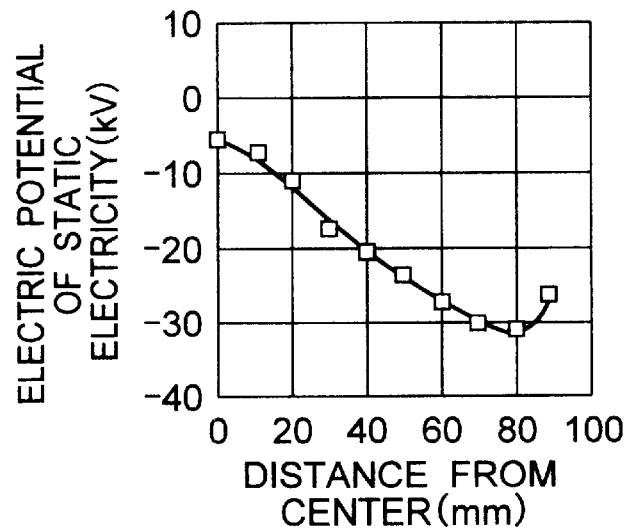
FIG. 18 is a characteristic view which shows an electric potential of a static electricity generated on a surface of the cleaning plate in the conventional apparatus in accordance with a relation with respect to a distance from a center of the cleaning plate.
Figure 19:
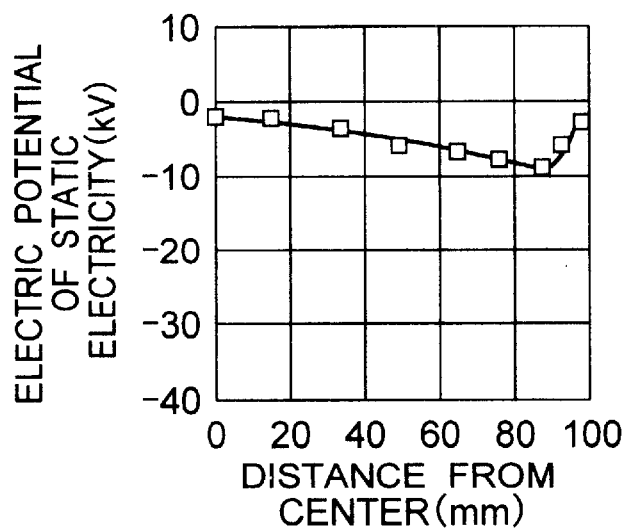
FIG. 19 is a characteristic view which shows an electric potential of a static electricity on a substrate generated by the conventional apparatus in accordance with a relation with respect to a distance from a center of the cleaning plate.
Figure 20:
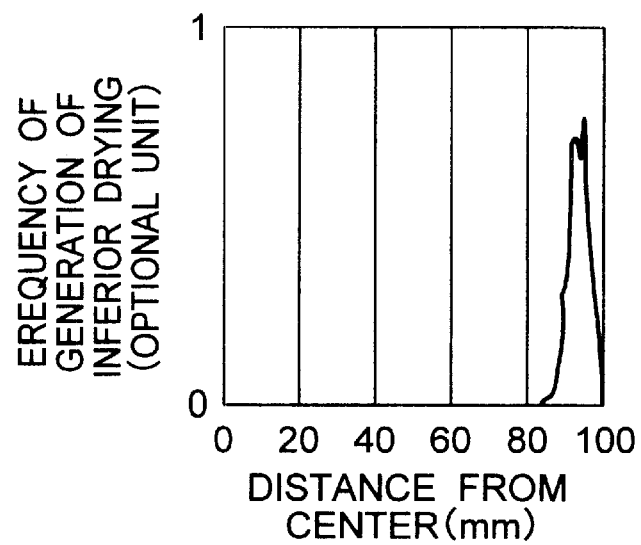
FIG. 20 is a view which shows a distribution of inferior drying generated on the substrate by the conventional apparatus.

FIG. 16 is a cross sectional view which schematically shows a main portion of the cleaning apparatus in accordance with the present invention. In FIG. 16, reference numerals 3 and 5 respectively denote an upper cleaning plate and a lower cleaning plate corresponding to treating plates, and fluid supply ports 3a and 5a are respectively provided in center portions thereof. Reference numeral 4 denotes a substrate to be treated, and reference numeral 6 denotes a substrate holding apparatus which is provided with a chuck mechanism for holding the substrate to be treated.

The upper cleaning plate 3 and the lower cleaning plate 5 are respectively arranged so as to form a gap of a fixed interval with respect to the substrate to be treated 4, a fluid necessary for cleaning is subsequently supplied to the gap from the fluid supply ports 3a and 5a in accordance with the cleaning process, thereby performing the fluid treatment of the substrate to be treated. That is, the structure is made such that the cleaning fluid, the rinsing fluid, the drying gas and the like are subsequently supplied to the fluid supply ports 3a and 5a in accordance with the cleaning process by means of the switching valve.

Further, the structure is made such that at least the electrically conductive portions of the surface opposing to the substrate to be treated of these cleaning plates 3 and 5 are grounded and the cleaning plate is not charged.

In this apparatus, the structure is made such that the cleaning plates 3 and 5 are fixed and the substrate holding apparatus 6 which holds the substrate to be treated 4 rotates, however, the structure may be made such that the substrate holding apparatus 6 is fixed and the cleaning plates 3 and 5 are rotated in the inverse manner, or the structure may be made such that both of them are rotated. In this case, an important thing is that the cleaning plates 3 and 5 corresponding to the treating plate and the substrate to be treated 4 are relatively rotated, whereby the fluid flows through the gap and the surface of the substrate to be treated 4 is uniformly nipped by the fluid.

As the upper and lower cleaning plates 3 and 5 corresponding to the treating plate, for example, there can be used an electrically conductive body such as an anti-corrosive metal such as a stainless steel or the like, an electrically conductive carbon, an electrically conductive plastic formed body which is obtained by dispersing an electrically conductive material to the plastic so as to apply an electric conductivity, and the like, and an anticorrosive material may be suitably selected among them in accordance with the kind of the cleaning liquid. Further, in the case that the base material corresponding to the treating plate is a high resistance material such as an insulating material, the surface may be made electrically conductive by coating the electrically conductive layer on the surface of the treating plate.

The substrate to be treated 4 is suitably selected, for example, among a semiconductor substrate (a wafer), a magnetic disc substrate, an optical disc substrate, a liquid crystal substrate and the like in accordance with a cleaning purpose. Then, the substrate to be treated 4 is detachably held by the substrate holding apparatus 6 which is provided with the chuck mechanism.

In this case, in this embodiment, a description is given of the fluid treatment method and the apparatus which simultaneously process both of the surfaces of the substrate to be treated 4, however, it is possible to process only one surface as occasion demands. In this case, the fluid supply of any one of the upper cleaning plate and the lower cleaning plate 3 and 5 may be stopped.

Further, in the case that it is initially intended to perform the fluid treatment of only one surface, it is possible to omit any one of the upper and the lower cleaning plates 3 and 5 so as to simplify the structure of the apparatus.

Hereinafter, a description will be given of a fluid treatment method for a substrate and a fluid treatment apparatus in accordance with the present invention with reference to the cleaning apparatus shown in FIG. 16.

<Embodiments 1 and 2>

The substrate 4 is held by the substrate holding apparatus 6 and the substrate holding apparatus 6 is rotated by a hollow motor. The upper cleaning plate 3 and the lower cleaning plate 5 are fixed. The structure is made such that the cleaning liquid, the rinsing liquid and the drying nitrogen corresponding to the treating fluid are subsequently supplied from the center portions of the upper and lower cleaning plates by the switching valve.

Figure 21:
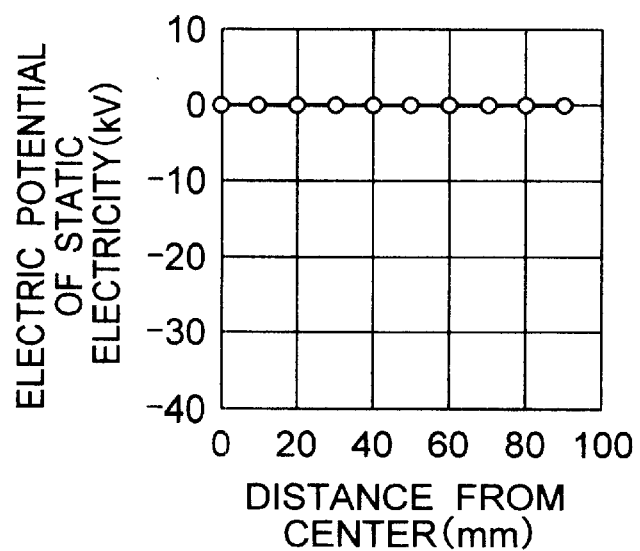
FIG. 21 is a characteristic view which shows an electric potential of a static electricity generated on a surface of the cleaning plate in the apparatus of the present invention in accordance with a relation with respect to a distance from a center of the cleaning plate.

In order to prevent the static electricity from generating, the electrically conductive carbon material is used for the upper cleaning plate 3 and the upper cleaning plate 3 is grounded. FIG. 21 shows a result of measuring the electric potential of the static electricity of the surface of the cleaning plate after the drying operation. It is known that the static electricity is not generated on all the surface at all.

Further, the conditions for the cleaning process are the same as those of the comparative embodiment (the conventional embodiment) described below, and the result is totally expressed in Table 1.

The upper cleaning plate 3 made of a polytetrafluoroethylene is employed as the conventional embodiment, the upper cleaning plate 3 made of a carbon (embodiment 1) and the upper cleaning plate made of a polytetrafluoroethylene (embodiment 2) are employed as the embodiment of the present invention, and a comparing experiment is performed.

Further, in both of the conventional embodiment and the embodiments of the present invention, the lower cleaning plate 5 is made of a polytetrafluoroethylene. In order to easily recognize the generation of the inferior drying, a silicon wafer in which a polysilicon doped by a phosphorous is formed on the fine pattern with step of 500 nm so as to form a film is employed for the substrate to be treated 4.

At first, the film forming surface of the polysilicon doped by the phosphorous in the silicon wafer corresponding to the surface to be treated of the substrate 4 is held to the substrate holding apparatus 6 so as to oppose to the upper cleaning plate 3.

Next, the substrate 4 is rotated at 100 rpm, is treated by a mixed water solution of an ammonia and a hydrogen peroxide so as to remove the contamination, is rinsed by an ultra pure water, thereafter, is treated by a water solution of a hydrofluoric acid so as to remove the natural oxidation film, and is rinsed by the ultra pure water. Thereafter, at the same time of increasing the number of rotation of the substrate to 1000 rpm, the nitrogen gas is supplied so as to perform a drying operation.

The surface of the substrate (the polysilicon film forming surface doped by the phosphorous) after the treatment is observed all around the surface by a scanning electron microscope and the number of the generated inferior drying is counted. The result is expressed in Table 1.

As shown in Table 1, in accordance with the present invention, it is possible to perform the process which generates no inferior drying.

TABLE 1

| SPECIFICATION OF TREATING PLATE 3 | NUMBER OF INFERIOR DRYING (NUMBER/8 INCH WAFER) |
| --- | --- |
| CLEANING PLATE MADE OF CARBON (EMBODIMENT 1) | 0 |

TABLE 1-continued

| SPECIFICATION OF TREATING PLATE 3 | NUMBER OF INFERIOR DRYING (NUMBER/8 INCH WAFER) |
| --- | --- |
| CLEANING PLATE MADE OF CARBON COATED POLYTETRAFLUOROETHYLENE (EMBODIMENT 2) | 0 |
| CLEANING PLATE MADE OF POLYTETRAFLUOROETHYLENE (COMPARATIVE EMBODIMENT) | 25 |

<Embodiment 3>

A magnetic disc substrate obtained by forming Ni—P plating film on both surfaces of an aluminum alloy substrate is employed for the substrate to be treated 4 and the cleaning process is performed. The electrically conductive carbon material which is the same as the embodiment 1 is employed for both of the upper cleaning plate 3 and the lower cleaning plate 5 corresponding to the treating plate, and both cleaning plates are respectively grounded. The known cleaning fluid, rinsing fluid and drying gas are subsequently supplied form the fluid supply ports 3a and 5a, respectively, and the cleaning and drying operations are performed in the same manner as that of the embodiment 1. As a result, a good cleaning effect can be obtained in both surfaces of the substrate 4.

As in detail mentioned above, the preset objects can be achieved by the present invention. That is, it is possible to perform the process without generating the inferior drying of the substrate by employing the fluid treatment method and the fluid treatment apparatus in accordance with the present invention.

What is claimed is:

1. A cleaning apparatus for a plate-shaped part comprising:

supporting and rotating means which supports the plate-shaped part having two flat surfaces being substantially in parallel to each other and which rotates the plate-shaped part;

a cleaning plate which is placed with respect to the plate-shaped part rotated by said supporting and rotating means so as to oppose to at least one of said two flat surfaces in a parallel state;

treating fluid injecting means which injects a treating fluid to one flat surface of said plate-shaped part from said cleaning plate so as to clean the one flat surface; and potential difference applying means which applies a potential between said plate-shaped part and said cleaning plate so as to control a chemical condition so as to enable cleaning of the one flat surface of said plate-shaped part.

2. A cleaning apparatus for a plate-shaped part comprising:

supporting and rotating means which supports the plate-shaped part having two flat surfaces being substantially in parallel to each other and which rotates the plate-shaped part;

a cleaning plate which is placed with respect to the plate-shaped part rotated by said supporting and rotating means so as to oppose to at least one of said two flat surfaces in a parallel state;

treating fluid injecting means which injects a treating fluid for cleaning and drying to the one flat surface of said plate-shaped part from said cleaning plate; and potential difference applying means which applies a potential between said plate-shaped part and said cleaning plate so as to control a chemical condition so as to enable cleaning and drying of the one flat surface of said plate-shaped part.

3. A cleaning apparatus for a plate-shaped part comprising:

supporting and rotating means which supports the plate-shaped part having two flat surfaces being substantially in parallel to each other and which rotates the plate-shaped part;

a cleaning plate which is placed with respect to the plate-shaped part rotated by said supporting and rotating means so as to oppose to at least one of said two flat surfaces in a parallel state;

treating fluid injecting means which injects a treating fluid for cleaning and drying to the one flat surface of said plate-shaped part from said cleaning plate so as to clean one flat surface; and potential difference applying means which applies a negative potential to said plate-shaped part with respect to said cleaning plate so as to control a chemical condition so as to enable cleaning and drying of the one flat surface of said plate-shaped part.

4. A cleaning apparatus for a plate-shaped part comprising:

supporting and rotating means which supports the plate-shaped part having two flat surfaces being substantially in parallel to each other and which rotates the plate-shaped part;

a pair of cleaning plates which are placed with respect to the plate-shaped part rotated by said supporting and rotating means so as to oppose to said two flat surfaces in a parallel state;

treating fluid injecting means which injects a treating fluid to a respective flat surface of said plate-shaped part from each of said pair of cleaning plates so as to clean the two flat surface; and potential difference applying means which applies a potential between said plate-shaped part and said pair of cleaning plates so as to control a chemical condition so as to enable cleaning of the two flat surfaces of said plate-shaped part.

5. A cleaning apparatus for a plate-shaped part as claimed in claim 1, 2, 3 or 4, wherein said cleaning plate is constituted by a material which is electrically conductive, and electric power supplying means for supplying electric current to said cleaning plate is provided as said potential difference applying means.

6. A cleaning apparatus for a plate-shaped part as claimed in claim 1, 2, 3 or 4, wherein said cleaning plate is constituted by a material having an electrification characteristic, and said potential difference applying means is structured such as to apply a potential sufficient to enable removal of a static electricity charge generated by a relative motion between said cleaning plate and said plate-shaped part.

7. A cleaning apparatus for a plate-shaped part as claimed in claim 1, 2, 3 or 4, wherein said cleaning plate is constituted by a material which is electrically conductive, said cleaning plate having an insulative coating applied to at least the surface opposing to said plate-shaped part, and electric power supplying means for supplying electric current to an electrically conductive portion of said cleaning plate is provided as said potential difference applying means.

8. A cleaning apparatus for a plate-shaped part as claimed in any one of claims 1 to 4, wherein a supporting member for supporting said plate-shaped part in said supporting and rotating means is constituted by a material which is electrically conductive, and electric power supplying means for supplying electric current to said supporting member is provided as said potential difference applying means.

9. A cleaning apparatus according to claim 1, wherein said treating fluid injecting means injects said treating fluid while said plate-shaped part is simultaneously rotated by said supporting and rotating means so as to clean the one flat surface.

10. A cleaning apparatus according to claim 1, wherein said supporting and rotating means includes a chuck mechanism for holding the plate-shaped part as a substrate to be treated, said cleaning plate as a treating plate is provided so as to oppose to both front and back surfaces of said substrate to be treated and to form a gap corresponding to a fluid passage on the opposing surfaces, said treating fluid injecting means injecting the treating fluid from a center portion of said treating plate while rotating said substrate to be treated with respect to said treating plate so as to supply the treating fluid to the gap corresponding to said fluid passage, wherein said treating plate is constituted by an electrically conductive material having a surface natural resistance of 1 GΩ or less and said treating plate is grounded on the earth.

11. A cleaning apparatus for a plate-shaped part as claimed in any one of claims 1–4, wherein said plate-shaped part is one of a semiconductor wafer, a magnetic recording disk medium, a liquid crystal display panel, and a Braun tube shadow mask.

* * * * *